(12) United States Patent
Kawabe et al.

(10) Patent No.: US 8,404,797 B2
(45) Date of Patent: Mar. 26, 2013

(54) POLYFUNCTIONAL VINYL AROMATIC COPOLYMER, PROCESS FOR PRODUCING THE SAME, AND RESIN COMPOSITION

(75) Inventors: Masanao Kawabe, Kitakyushu (JP); Hiroko Terao, Kitakyushu (JP); Natsuko Okazaki, Kitakyushu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 81 days.

(21) Appl. No.: 12/736,055

(22) PCT Filed: Mar. 3, 2009

(86) PCT No.: PCT/JP2009/053938
§ 371 (c)(1),
(2), (4) Date: Jan. 18, 2011

(87) PCT Pub. No.: WO2009/110453
PCT Pub. Date: Sep. 11, 2009

(65) Prior Publication Data
US 2011/0105638 A1 May 5, 2011

(30) Foreign Application Priority Data

| Mar. 4, 2008 | (JP) | 2008-053183 |
| Mar. 27, 2008 | (JP) | 2008-083714 |
| Mar. 31, 2008 | (JP) | 2008-090559 |

(51) Int. Cl.
*C08G 63/78* (2006.01)
*C08F 2/50* (2006.01)
*C08F 2/46* (2006.01)
*C08J 3/28* (2006.01)
*B29D 11/00* (2006.01)
*G02B 1/04* (2006.01)

(52) U.S. Cl. ........ 528/205; 522/153; 522/160; 522/181; 522/178; 522/184; 522/188; 525/391; 525/451; 526/209; 526/284; 526/347; 526/336; 526/335; 526/347.1; 526/72; 264/1.1; 264/1.34; 264/1.36; 264/1.38

(58) Field of Classification Search .................. 522/153, 522/160, 181, 182, 178, 184, 188; 528/205; 528/206; 525/391, 451; 526/209, 284, 347; 526/336, 335, 347.1, 72; 264/1.1, 1.34, 1.36, 264/1.38
See application file for complete search history.

(56) References Cited

U.S. PATENT DOCUMENTS

2009/0137692 A1 * 5/2009 Mori et al. ................. 521/65

FOREIGN PATENT DOCUMENTS

| EP | 2055722 A1 | 5/2009 |
| JP | 08-258171 A | 10/1996 |
| JP | 2002-525424 A | 8/2002 |
| JP | 2007-308634 A | 11/2007 |
| JP | 2007-332273 A | 12/2007 |
| JP | 2008-189745 A | 8/2008 |
| JP | 2008239781 A * | 10/2008 |
| JP | 2008247978 A * | 10/2008 |
| JP | 2008248140 A * | 10/2008 |
| WO | WO-2008/123199 A1 | 10/2008 |

OTHER PUBLICATIONS

Supplementary European Search Report dated Jul. 29, 2011, issued for the European patent application No. 09717608.5.
Notification of Concerning Transmittal of International Preliminary Report on Patentability (Chapter I of the Patent Cooperation Treaty), issued for PCT/JP2009/053938 (1 sheet).
International Preliminary Report on Patentability (Chapter I of the Patent Cooperation Treaty) and Written Opinion of the International Searching Authority, issued for PCT/JP2009/053938 and English Translation thereof (12 pages).
International Search Report dated May 26, 2009, issued for PCT/JP2009/053938.

* cited by examiner

*Primary Examiner* — Sanza McClendon
(74) *Attorney, Agent, or Firm* — Edwards Wildman Palmer LLP; James E. Armstrong, IV; Weiying Yang

(57) ABSTRACT

An end-modified soluble polyfunctional vinyl aromatic copolymer, which is improved in heat resistance, thermal stability, solvent solubility, and compatibility with acrylate compounds, and a curable resin composition using the same are disclosed. The end-modified soluble polyfunctional vinyl aromatic copolymer is obtained by allowing a divinyl aromatic compound (a), a monovinyl aromatic compound (b), and an aromatic ether compound (c) to react with each other, and has, at an end, an end group derived from the aromatic ether compound and having an acrylate bond. The copolymer has a number average molecular weight Mn of 500 to 100,000, an introduction amount (c1) of the end group derived from the aromatic ether compound satisfies (c1)$\geq$1.0 (group/molecule), a molar fraction a' of a structural unit derived from the divinyl aromatic compound and a molar fraction b' of a structural unit derived from the monovinyl aromatic compound in the copolymer satisfy $0.05 \leq a'/(a'+b') \leq 0.95$. Besides, the curable resin composition includes the copolymer and an unsaturated acrylate monomer.

16 Claims, No Drawings

POLYFUNCTIONAL VINYL AROMATIC COPOLYMER, PROCESS FOR PRODUCING THE SAME, AND RESIN COMPOSITION

TECHNICAL FIELD

The present invention relates to an end-modified soluble polyfunctional vinyl aromatic polymer having improved heat resistance, compatibility, and heat discoloration resistance, and a production method for the soluble polyfunctional vinyl aromatic polymer. In addition, the present invention relates to a resin composition including the soluble polyfunctional vinyl aromatic polymer, and a cured product and a molded product obtained by curing or molding the resin composition.

BACKGROUND ART

Many of monomers having reactive unsaturated bonds can produce polymers by selecting a catalyst for cleaving the unsaturated bonds and causing a chain reaction and appropriate reaction conditions. Such monomers having unsaturated bonds are typified, for example, by versatile monomers including vinyl aromatic compounds such as styrene, alkylstyrene, and alkoxystyrene. In addition, a wide variety of resins are being synthesized by polymerizing each of the vinyl aromatic compounds alone or copolymerizing the vinyl aromatic compounds with each other.

However, applications of polymers resulting from such vinyl aromatic compounds are mainly limited to fields of relatively inexpensive consumer appliances. The polymers are hardly applied to advanced technologies, which require high functionality and high thermal and mechanical characteristics, such as printed circuit boards in electrical and electronic fields. One of the reasons is that a thermal characteristic such as heat resistance or thermal stability and processability such as solvent solubility or film moldability cannot be attained simultaneously.

As for a method of solving such drawbacks in conventional vinyl aromatic-based polymers, Patent Document 1 discloses a soluble polyfunctional vinyl aromatic copolymer obtained by polymerizing a divinyl aromatic compound with a monovinyl aromatic compound at a temperature of 20 to 100° C. in the presence of a Lewis acid catalyst and an initiator having a specific structure in an organic solvent. Further, Patent Document 2 discloses a production method for a soluble polyfunctional vinyl aromatic copolymer having a molecular weight distribution controlled by subjecting monomer components containing 20 to 100 mol % of a divinyl aromatic compound to cationic polymerization at a temperature of 20 to 120° C. using a Lewis acid catalyst and an initiator having a specific structure in the presence of a quaternary ammonium salt. The soluble polyfunctional vinyl aromatic copolymer obtained by the technology disclosed in each of those two patent documents is excellent in solvent solubility and processability and can be used to provide a cured product having a high glass transition temperature and being excellent in heat resistance.

The soluble polyfunctional vinyl aromatic copolymer obtained by each of those technologies has itself a polymerizable double bond and hence is cured to give a cured product having a high glass transition temperature. It can therefore be said that the cured product or the soluble polyfunctional vinyl aromatic copolymer is a polymer excellent in heat resistance or a precursor thereof. Moreover, the soluble polyfunctional vinyl aromatic copolymer is copolymerized with any other radical polymerizable monomer to give a cured product. Moreover, the cured product is also a polymer excellent in heat resistance.

From the viewpoints of compatibility during copolymerization of the soluble polyfunctional vinyl aromatic copolymer with any other radical polymerizable monomer, and heat discoloration resistance after curing, the compatibility or solubility with a highly versatile (meth)acrylate compound is insufficient, and the thermal stability to high process temperatures is also insufficient. Thus, some kinds of (meth)acrylate compounds give opaque compositions in many cases, resulting in a difficulty of uniform copolymerization of the (meth) acrylate compound with the soluble polyfunctional vinyl aromatic copolymer. This causes a drawback of reducing the degree of freedom of designing for compounding formulations. In addition, failures such as blistering and discoloration occur through a high thermal history of around 280 to 300° C. in some cases.

Meanwhile, Patent Document 3 discloses a production method for an isobutylene-based polymer having a hydroxy group at the termination end, the method involving subjecting cation polymerizable monomers each containing isobutylene to living cationic polymerization at a low temperature in the presence of a halogen-containing organic compound having a specific structure serving as an initiator and also serving as a chain transfer agent and an Lewis acid to synthesize an isobutylene-based polymer having an isobutyryl group at the end, and further performing a Friedel-Crafts-type reaction of the isobutylene-based polymer having an isobutylene group at the end with a phenol-based compound having a specific structure in the presence of a Lewis acid. However, there has been a problem in that the isobutylene polymer having isobutylene at the end synthesized by the production method has no pendant vinyl group owing to the use of no polyfunctional vinyl aromatic compound, and hence a molded product has a low glass transition temperature and is not applicable to advanced technological fields, which require high functionality and high thermal and mechanical characteristics, such as electrical and electronic fields. Further, the terminal group introduced in the production method is a phenolic hydroxy group derived from a phenol-based compound.

Further, Patent Documents 4 to 6 each disclose a phenol aralkyl resin obtained by allowing an aromatic compound containing a phenolic hydroxy group to react with an aromatic compound containing at least two or more ethylenically unsaturated bonds.

Still further, Patent Document 7 discloses a soluble polyfunctional vinyl aromatic copolymer obtained by copolymerizing a divinyl aromatic compound with a monovinyl aromatic compound, in which the copolymer has a linear hydrocarbon group or an aromatic hydrocarbon group via an ether bond or a thioether bond as part of terminal groups. However, such end-modified soluble polyfunctional vinyl aromatic copolymer is also insufficient in compatibility, heat resistance, and the like in some cases. In addition, the end group having an ether bond disclosed in Patent Document 7 has been introduced through a reaction mechanism in which an OH group in an OH group-containing compound such as benzyl alcohol reacts with a polymer chain end.

Patent Document 1: JP 2004-123873 A
Patent Document 2: JP 2005-213443 A
Patent Document 3: JP 04-20501 A
Patent Document 4: JP 3206672 B2
Patent Document 5: JP 08-73570 A
Patent Document 6: JP 08-259665 A
Patent Document 7: JP 2007-332273 A
Patent Document 8: JP 2003-306619 A Patent Document 9: JP 2006-240292 A
Patent Document 10: JP 2005-213443 A
Patent Document 11: JP 11-61081 A
Patent Document 12: JP 05-86136 A
Patent Document 13: JP 2002-20441 A
Patent Document 14: JP 2006-193660 A
Patent Document 15: JP 2002-509273 A Meanwhile, plastic is used in a large amount in various industries such as the automobile industry, the household appliance industry, and the electrical and electronic industry. The reason why plastic is used in a large amount is based on its light weight, low cost, optical characteristics, and the like in addition to its processability and transparency. However, plastic is softer as compared to glass and the like and hence has drawbacks such as a large sensitivity to surface scratches. In order to solve those drawbacks, a method involving coating the surface of plastic with a hard coating agent has been employed as generally used means.

Used as the hard coating agent is a thermocurable hard coating agent such as a silicon-based coating material, an acrylic coating material, or a melamine-based coating material. Of those, in particular, a silicon-based hard coating agent has been heavily used because of its high hardness and excellent quality. This type of coating agent is mostly used for high-value-added products such as eyeglasses and lenses. However, the coating agent has a long curing time and is expensive, and thus is far from being suitable for hard coating of a film or sheet (hereinafter, referred to as a film or the like) to be subjected to continuous processing.

In recent years, a photosensitive acrylic hard coating agent has been developed and utilized. A photosensitive hard coating agent is cured immediately by irradiation with light such as ultraviolet rays to form a hard coated film to thereby provide a high processing speed and has excellent performance such as scratch resistance, leading to reduced total cost. Thus, the photosensitive hard coating agent is a primary hard coating agent at present. In particular, the photosensitive hard coating agent is suitable for continuous processing of a film or the like made of polyester or the like. There are exemplified, as materials for a film or the like made of plastic, polyester, polyacrylate, acryl, polycarbonate, vinyl chloride, triacetylcellulose, and polyether sulfone. A film or the like made of polyester, polycarbonate, and acryl is one kind of most widely used films or the like because of its various excellent features. Such film or the like made of a resin is widely used for a glass scattering preventing film, a light shielding film for automobiles, a surface film for whiteboards, a system kitchen surface antifouling film, or the like, and for a functional film or sheet for touch panels, liquid crystal displays, CRT flat televisions, and the like as an electronic material. In all of those applications, the hard coating agent is applied in order to prevent a surface from being easily scratched (Patent Documents 8 and 9).

In addition, in a display such as a CRT display and an LCD display using a film or the like coated with the hard coating agent, a problem arises in that reflection degrades the visibility of a display screen, with the result that eyes are easily tired. Thus, some of applications need a hard coat treatment having a surface reflection preventing ability. There is exemplified, as a method of preventing surface reflection, a method of preventing reflection by coating a film or sheet with a dispersion of an inorganic filler or an organic microparticle filler in a photosensitive resin to make irregularities on a surface (AG treatment), a method of preventing glare and reflection based on a difference in refractive index by providing a high refractive index layer and a low refractive index layer as a multilayer structure in the stated order on a film or sheet (AR treatment), or an AG/AR treatment method using the above-mentioned two methods in combination.

It should be noted that Patent Document 1 and 10 each disclose a soluble polyfunctional vinyl aromatic copolymer obtained by subjecting a divinyl aromatic compound (a) and a monovinyl aromatic compound (b) to polymerization at a temperature of 20 to 100° C. in the presence of a Lewis acid catalyst and an initiator having a specific structure in an organic solvent. In addition, the patent documents disclose that the soluble polyfunctional vinyl aromatic copolymer is excellent in solvent solubility and processability, and can be used to provide a cured product excellent in heat resistance and thermal stability. However, none of the patent documents teaches applications to the hard coating agent.

In a photosensitive resin composition for hard coating used for a film substrate made of polyacryl, polyester, an MS resin, or the like used for a film or sheet provided with a hard coated layer, a polyfunctional resin is often used in order to increase a crosslinking density and improve hardness. Thus, because the photosensitive resin composition for hard coating has high hardness but is insufficient in flexibility and stiffness, cracking occurs during bending as secondary processing or failures such as floating, peeling and cracking occur during punching processing. Therefore, the improvement of secondary processability has been a critical issue. Further, the blending of the polyfunctional resin in a large amount results in large curing shrinkage and high polarity. Thus, in low-polar, poorly adhesive resins such as an MS resin, polyacryl, and polycycloolefin, in particular, there have been problems in that drawbacks such as insufficient adhesiveness and warpage of a hard coated film or sheet occur. In contrast, when the adhesiveness is emphasized, there has been a problem in that the use of a resin having low polarity and having a small number of functional group leads to insufficient improvements in hardness and scratch resistance. Therefore, a hard coating agent for a film or sheet substrate made of a poorly adhesive MS resin, polyacryl, polycycloolefin, and the like is insufficient in terms of adhesiveness, scratch resistance, and punching processability. Accordingly, there is a demand for a photosensitive resin composition for hard coating, by which those problems can be solved, and a cured product thereof, a hard coated film or sheet, and an optical device and an image display device having such hard coated films or sheets laminated.

Hitherto, in general, an acrylic resin or a cycloolefin resin excellent in transparency and light resistance or a polycarbonate resin excellent in heat resistance has been heavily used as a resin for an optical member. Meanwhile, the resin for an optical member utilized in fields of optics and electronics requires heat resistance and mechanical characteristics during mounting processes to electronic substrates and the like and high-temperature operations, and an epoxy-based resin has been frequently used as the resin. However, as a result of the growth of application fields of an optical member in recent years, there is a demand for a resin having more improved optical characteristics, heat resistance, and mechanical characteristics, having more excellent moldability, and having less characteristic change due to an environmental change than ever before. For example, in fields of optics and electronics for vehicles, various monitors and sensors are considered to be installed in response to electronic control and system modularization, and an optical member to be used in each of the monitors and sensors requires high reliability.

However, the above-mentioned optical resin material satisfies only a part of various characteristics necessary in advanced technical fields, which require the resistance to the use in such harsh environments, that is, various characteristics such as low water absorbency, heat resistance, moldability, mold transfer property, and mold release property. Thus, in the present circumstances, although the resin material has excellent degree of freedom of shape, lightweight property, and moldability as compared to a glass material, the resin material is not used as a material for an optical member in advanced technical fields, which require such strict environmental resistance characteristics, optical characteristics, and moldability, and the glass material is mainly used instead.

Hitherto, investigations have been made on a curable resin composition containing a polymerizable unsaturated monomer having a cycloalkyl group as a material solving the above-mentioned drawbacks of the resin material which has been used for an optical member in a large amount and being excellent in transparency, heat resistance, and low water absorbency (Patent Documents 11 to 13).

Patent Document 14 discloses a resin composition containing a (meth)acrylate having an aliphatic hydrocarbon group having 4 or less carbon atoms in an ester moiety as a monomer component (A), an alicyclic polyfunctional (meth)acrylate as a monomer component (B), and a polymerization initiator (D), in which the resin composition is cured with heating or light.

Patent Document 15 discloses a polymerizable organic composition containing (a) an aromatic monomer having at least two vinyl groups, (b) a polythiol monomer having at least two thiol groups, and (c) an anhydride monomer having at least one ethylenically unsaturated group, provided that a polymerizate of the polymerizable organic composition has a refractive index of at least 1.57 and an Abbe number of at least 33 for the purpose of attaining an improvement in a refractive index.

DISCLOSURE OF THE INVENTION

Problem to be Solved by the Invention

An object of the present invention is to provide an end-modified polyfunctional vinyl aromatic copolymer having excellent heat resistance and heat discoloration resistance to a high heat history, being excellent in compatibility with a (meth)acrylate compound, and having both a controlled molecular weight distribution excellent in molding processability and solvent solubility, and a production method for the copolymer with high efficiency. Another object of the present invention is to provide a photosensitive resin composition and a hard coated film or sheet showing satisfactory adhesiveness particularly to poorly adhesive films or sheets made of an MS resin, polyacryl, polycycloolefin, and the like, having excellent scratch resistance, and further, being capable of resisting secondary processing such as punching processing. Still another object of the present invention is to provide a curable resin composition having mold transfer property during molding, mold release property, and low water absorbency improved, being excellent in transparency, heat resistance, and mechanical strength, and having less characteristic change due to an environmental change.

Methods for Solving the Problems

The present invention relates to a soluble polyfunctional vinyl aromatic copolymer, including a copolymer which is obtained by allowing the following compounds to react with each other: a divinyl aromatic compound (a); a monovinyl aromatic compound (b); and an aromatic ether compound (c), in which: the copolymer has, at an end, a end group derived from the aromatic ether compound (c) represented by the following formula (1):

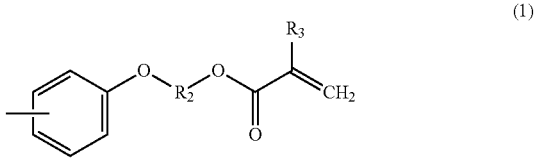

where: $R_2$ represents a hydrocarbon group having 1 to 18 carbon atoms and optionally including an oxygen atom or a sulfur atom; and $R_3$ represents hydrogen or a methyl group;

the copolymer has a number average molecular weight Mn of 500 to 100,000; the copolymer has a molecular weight distribution (Mw/Mn) of 100.0 or less, the molecular weight distribution being represented by a ratio of a weight average molecular weight Mw to a number average molecular weight Mn; the introduction amount (c1) of the above-mentioned end group satisfies the following inequality (2):

$$(c1) \geq 1.0 \text{(group/molecule)} \qquad (2);$$

the molar fraction a' of a structural unit derived from the divinyl aromatic compound, the molar fraction b' of a structural unit derived from the monovinyl aromatic compound, and the molar fraction c' of the above-mentioned end group in the copolymer satisfy relationships of the following inequalities (3) and (4):

$$0.05 \leq a'/(a'+b') \leq 0.95 \qquad (3)$$

$$0.005 \leq c'/(a'+b') < 2.0 \qquad (4); \text{ and}$$

the copolymer is soluble in toluene, xylene, tetrahydrofuran, dichloroethane, or chloroform.

Further, the present invention relates to a manufacturing method for a soluble polyfunctional vinyl aromatic copolymer, including allowing the following compounds to react with each other: a divinyl aromatic compound (a); a monovinyl aromatic compound (b); and an aromatic ether compound (c), in which: 5 to 95 mol % of the divinyl aromatic compound (a) and 95 to 5 mol % of the monovinyl aromatic compound (b) are used with respect to 100 mol % of a total of the divinyl aromatic compound (a) and the monovinyl aromatic compound (b); 0.5 to 500 mol of the aromatic ether compound (c) represented by the following formula (7) with respect to 100 mol of all monomers, and one or more kinds of catalysts (d) selected from the group consisting of a Lewis acid catalyst, an inorganic strong acid, and an organic sulfonic acid are further used; polymerization raw materials including the compounds and the catalysts are dissolved in a solvent having a dielectric constant of 2.0 to 15.0 to form a uniform solvent; and the compounds are polymerized at a temperature of 20 to 120° C. in the uniform solvent to provide a copolymer having, at an end, a end group represented by the above-mentioned formula (1) at a ratio of 1.0 (group/molecule) or more and being soluble in toluene, xylene, tetrahydrofuran, dichloroethane, or chloroform.

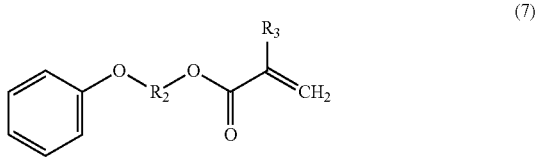

(7)

In the formula (7), $R_2$ and $R_3$ have the same meanings as those in the formula (1).

In the above-mentioned production method for a soluble polyfunctional vinyl aromatic copolymer, it is a preferred embodiment that the catalysts (d) include a Lewis acid catalyst including a metal fluoride or a complex thereof and the catalysts (d) are used in a range of 0.001 to 10 mol with respect to 1 mol of the aromatic ether compound (c).

Further, the present invention relates to a photosensitive resin composition, including:

a component (A): the above-mentioned soluble polyfunctional vinyl aromatic copolymer;

a component (B): one or more kinds of photo curable polyfunctional (meth)acrylates having at least three (meth)acryloyl groups in a molecule; and a component (C): a photopolymerization initiator, in which the component (A) is blended in an amount of 1 to 75 wt %, the component (B) is blended in an amount of 98.9 to 10 wt %, and the component (C) is blended in an amount of 0.1 to 15 wt %.

It is preferred that the above-mentioned photosensitive resin composition include, as a component (D), 0.1 to 20 wt % of one or more kinds of (meth)acrylate compounds selected from the group consisting of monofunctional and bifunctional acrylates.

Further, the present invention relates to a photosensitive resin cured product, in which the photosensitive resin cured product is obtained by curing the above-mentioned photosensitive resin composition. In addition, the present invention relates to a hard coated film or sheet, in which the hard coated film or sheet is obtained by applying the above-mentioned photosensitive resin composition onto a substrate having a film or sheet shape, and curing the resultant with active energy rays.

Further, the present invention relates to a curable resin composition, including:

a component (A): the above-mentioned soluble polyfunctional vinyl aromatic copolymer; and a component (F): one or more kinds of polymerizable unsaturated monomers each having a cycloalkyl group and having one or two (meth)acryloyl groups in a molecule, in which the component (A) is blended in an amount of 1 to 80 wt % and the component (F) is blended in an amount of 99 to 20 wt %.

It is preferred that the above-mentioned curable resin composition include any one or more of the following components: 1) as a component (G), 0.01 to 15 wt % of a polymerization initiator based on the sum of the component (A) and the component (F); 2) as a component (H), 0.5 to 40 wt % of a polyfunctional thiol compound; and 3) as a component (I), 1 to 40 wt % of a polymerizable unsaturated monomer having 1 to 10 (meth)acryloyl groups excluding the component (F).

Further, the present invention relates to an optical resin cured product, in which the optical resin cured product is obtained by curing the above-mentioned curable resin composition.

Further, the present invention relates to an optical material, in which the optical material is obtained by curing and molding the above-mentioned curable resin composition.

Further, the present invention relates to an optical film, in which the optical film is obtained by molding and curing the above-mentioned curable resin composition into a film shape.

BEST MODE FOR CARRYING OUT THE INVENTION

First, a soluble polyfunctional vinyl aromatic copolymer of the present invention and a production method for the soluble polyfunctional vinyl aromatic copolymer are described. Next, a resin composition using the soluble polyfunctional vinyl aromatic copolymer of the present invention is described.

The soluble polyfunctional vinyl aromatic copolymer of the present invention is a copolymer obtained by allowing the following compounds to react with each other: a divinyl aromatic compound; a monovinyl aromatic compound; and an aromatic ether compound, in which the copolymer has a end group represented by the above-mentioned formula (1) derived from the aromatic ether compound containing an acrylate at part of the ends. In addition, the copolymer is soluble in toluene, xylene, tetrahydrofuran, dichloroethane, or chloroform. The soluble polyfunctional vinyl aromatic copolymer of the present invention is end-modified as described above, and hence is also referred to as an end-modified soluble polyfunctional vinyl aromatic copolymer, and unless misunderstandings may arise, abbreviated as a copolymer.

The soluble polyfunctional vinyl aromatic copolymer of the present invention has the terminal functional group represented by the above-mentioned formula (1) as a structural unit in addition to a structural unit derived from the divinyl aromatic compound and a structural unit derived from the monovinyl aromatic compound. As for the abundance (molar fraction) of each of the structural units, when the molar fraction of the structural unit derived from the divinyl aromatic compound is defined as a', the molar fraction of the structural unit derived from the monovinyl aromatic compound is defined as b', and the molar fraction of the end group is defined as c', the molar fractions satisfy the following relationships.

The ratio c'/(a'+b') must be 0.005 or more and less than 2.0, preferably 0.01 to 1.5, or more preferably 0.05 to 1.0. A resin composition having excellent heat resistance and heat discoloration resistance to high heat history, being excellent in compatibility with a (meth)acrylate compound, and being excellent in molding processability can be achieved by introducing the above-mentioned end group to the end of the copolymer of the present invention so that the above-mentioned relationship be satisfied. The molar fraction of the end group of less than 0.005 lowers compatibility with a (meth)acrylate compound and molding processability. The molar fraction of more than 2.0 prevents mechanical physical properties as a polymer for being maintained, and lowers heat resistance and heat discoloration resistance.

The introduction amount (c1) of end groups per molecule in the soluble polyfunctional vinyl aromatic copolymer of the present invention is 1.0 or more groups or preferably 2 to 5 groups on average. In the formula (1), in general, the end group is bonded to a main chain of the copolymer at a para position.

In addition, the soluble polyfunctional vinyl aromatic copolymer of the present invention has a ratio a'/(a'+b') ranging from 0.05 to 0.95, preferably 0.15 to 0.95, or more preferably 0.30 to 0.90 mol. The ratio b'/(a'+b') is calculated from a value of the ratio a'/(a'+b'). From another viewpoint, the soluble polyfunctional vinyl aromatic copolymer preferably contains the structural unit derived from the divinyl aromatic compound in an amount of 30 to 90 mol % with respect to 100 mol % of the total of all the structural units. The structural unit derived from the divinyl aromatic compound contains a vinyl group as a crosslinking component for expressing heat resistance. Meanwhile, the structural unit derived from the monovinyl aromatic compound is free of a vinyl group involved in a curing reaction, and hence imparts molding property and the like. Thus, the molar fraction of the structural unit derived from the divinyl aromatic compound of less than 0.05 results in insufficient heat resistance of a cured product, and the molar fraction of more than 0.95 lowers molding processability.

The soluble polyfunctional vinyl aromatic copolymer of the present invention has Mn (here, Mn is a number average molecular weight in terms of standard polystyrene to be measured using gel permeation chromatography) of 500 to 100,000, preferably 700 to 50,000, or more preferably 1000 to 20,000. The number average molecular weight Mn of less than 500 extremely lowers the viscosity of the copolymer, resulting in deterioration of processability, such as difficulty in thick film formation. Further, the number average molecular weight Mn of more than 100,000 is not preferred because it promotes gel formation and increases viscosity to degrade external appearance at the time of molding into a film or the like. The value of a molecular weight distribution (Mw/Mn) is 100.0 or less, preferably 50.0 or less, or more preferably 1.5 to 3.0. The molecular weight distribution Mw/Mn of more than 100.0 causes problems such as deterioration of processing characteristics of the copolymer and gel generation.

The soluble polyfunctional vinyl aromatic copolymer of the present invention is soluble in a solvent selected from toluene, xylene, tetrahydrofuran, dichloroethane, or chloroform, and is advantageously soluble in all of the above-mentioned solvents. In order that the copolymer is a polyfunctional copolymer soluble in a solvent, it is necessary that part of vinyl groups in divinylbenzene remains without crosslinking and the copolymer has appropriate degree of crosslinking. Such copolymer or a production method for the copolymer is known in the above-mentioned patent documents and the like.

The soluble polyfunctional vinyl aromatic copolymer of the present invention is functionalization of terminal groups with the above-mentioned functional groups, and hence has high compatibility with a (meth)acrylate compound. Thus, in the case of curing the copolymer obtained by copolymerization with a (meth)acrylate compound, a cured product excellent in uniform curing property and transparency is obtained.

Next, an invention relating to a production method capable of advantageously producing the soluble polyfunctional vinyl aromatic copolymer of the present invention is described. The production method for the soluble polyfunctional vinyl aromatic copolymer of the present invention is abbreviated as a production method for the copolymer of the present invention or a production method of the present invention in some cases.

In the production method for the copolymer of the present invention, a copolymer is produced by allowing the following compounds to react with each other: a divinyl aromatic compound (a); a monovinyl aromatic compound (b); and an aromatic ether compound (c).

As for the use amount of the divinyl aromatic compound (a) and the monovinyl aromatic compound (b), the divinyl aromatic compound (a) is used in an amount of 5 to 95 mol % and the monovinyl aromatic compound (b) is used in an amount of 95 to 5 mol % with respect to 100 mol % of the total of the compounds. It is preferred to use the divinyl aromatic compound (a) in an amount of 15 to 70 mol % and to use the monovinyl aromatic compound (b) in an amount of 85 to 30 mol %.

The divinyl aromatic compound (a) plays an important role as a crosslinking component for providing a branched and polyfunctional copolymer, and expressing heat resistance during curing a copolymer with heat. Examples of the divinyl aromatic compound (a) which is preferably used include, but are not limited to, divinylbenzene (both of m- and p-isomers), divinylnaphthalene (including the respective isomers), and divinylbiphenyl (including the respective isomers). Further, one kind of those compounds may be used alone, or two or more kinds thereof may be used in combination.

The monovinyl aromatic compound (b) improves the solvent solubility and processability of the copolymer. Examples of the monovinyl aromatic compound (b) include, but are not limited to, styrene, a nuclear alkyl-substituted monovinyl aromatic compound, an α-alkyl-substituted monovinyl aromatic compound, a β-alkyl-substituted styrene, and an alkoxy-substituted styrene. In order to prevent the copolymer from gelating and to improve the solvent solubility and processability of the copolymer, in particular, styrene, ethylvinylbenzene (both of m- and p-isomers), and ethylvinylbiphenyl (including the respective isomers) are preferably used from the viewpoints of cost and easy availability.

Further, in the production method for the copolymer of the present invention, it is possible to use another monomer (e) such as a trivinyl aromatic compound, a trivinyl aliphatic compound, a divinyl aliphatic compound, and a monovinyl aliphatic compound and to introduce the unit into the copolymer in addition to the divinyl aromatic compound (a) and the monovinyl aromatic compound (b) as long as the effects of the present invention are not impaired.

Specific examples of the another monomer (e) include, but are not limited to, 1,3,5-trivinylbenzene, 1,3,5-trivinylnaphthalene, 1,2,4-trivinylcyclohexane, ethylene glycol diacrylate, and butadiene. One kind of those compounds may be used alone, or two or more kinds thereof may be used in combination. It is recommended that another monomer (e) should be used in the range of less than 30 mol % of all monomers. Thus, a structural unit derived from another monomer component (e) is used in the range of less than 30 mol % with respect to the total amount of the structural units in the copolymer. It should be noted that the all monomers as used herein include not only a monomer having a polymerizable double bond such as the divinyl aromatic compound (a) or the monovinyl aromatic compound (b) but also the aromatic ether compound (c). Further, the monomer having a polymerizable double bond as used herein excludes the aromatic ether compound (c).

The aromatic ether compound (c) is represented by the above-mentioned formula (7). Here, $R_2$ and $R_3$ have the same meanings as those in the formula (1). The aromatic ether compound (c) is a compound that plays a role in introducing the end group represented by the formula (1), which allows for imparting a function such as adhesion property, into the end of the copolymer through the occurrence of a chain transfer reaction with a polymerization active species during a polymerization reaction. Thus, the aromatic ether compound (c) is also referred to as a polymerization additive, and is also a monomer because it provides the above-mentioned end group (one of the structural units) to the copolymer.

It is preferred to use 2-phenoxyethyl methacrylate and 2-phenoxyethyl acrylate as the aromatic ether compound (c) from the viewpoints of reactivity, easy availability, and heat resistance of a cured product.

The use amount of the aromatic ether compound (c) is 0.5 to 500 mol, preferably 1 to 100 mol, or more preferably 10 to 50 mol with respect to 100 mol of all monomers. A use amount of less than 0.5 mol decreases the introduction amount of the above-mentioned terminal functional groups, reduces a function such as compatibility with an acrylate compound, and besides, increases a molecular weight and a molecular weight distribution, resulting in deterioration of molding processability. Further, a use amount of more than 500 mol remarkably reduces a polymerization rate, reduces productivity, and besides, does not increase a molecular weight. It is estimated that, during a polymerization reaction, the aromatic ether compound (c) should react with a carbon cation derived from a vinyl group at the end of a growing polymer chain to form the above-mentioned end group and terminate the growth. The use amount and reaction condition of the aromatic ether compound (c) are selected so that the introduction amount of the end group derived from the aromatic ether compound (c) fall within the range in the description about the above-mentioned copolymer.

The polymerization reaction involves using the monomer having a polymerizable double bond, the aromatic ether compound (c), and a catalyst (d), dissolving polymerization raw materials including them in a solvent having a dielectric constant of 2.0 to 15.0 to form a uniform solvent, and performing cation copolymerization in the uniform solvent at a temperature of 20 to 120° C. to provide an end-modified copolymer. Here, the resultant end-modified copolymer is a copolymer having the above-mentioned end group at a ratio of 1.0 (group/molecule) or more and being soluble in toluene, xylene, tetrahydrofuran, dichloroethane, or chloroform.

Used as the catalyst (d) are one or more kinds selected from the group consisting of a Lewis acid catalyst, an inorganic strong acid, and an organic sulfonic acid.

The Lewis acid catalyst may be used without any particular limitation as long as the catalyst is a compound formed of a metal ion (acid) and a ligand (base), in which the compound can accept an electron pair. Of the Lewis acid catalysts, fluorides of divalent to hexavalent metals such as B, Al, Ga, In, Si, Ge, Sn, Pb, Sb, Bi, Ti, W, Zn, Fe, and V or complexes thereof are particularly preferred from the viewpoint of thermal stability of the resultant copolymer. Further, examples of the inorganic strong acid include sulfuric acid, hydrochloric acid, and phosphoric acid. Specific examples of the organic sulfonic acid include benzenesulfonic acid and p-toluenesulfonic acid. One kind of those catalysts may be used alone, or two or more kinds thereof may be used in combination. Boron trifluoride ether (e.g., diethyl ether or dimethyl ether) complex is most preferably used from the viewpoints of control of the molecular weight and molecular weight distribution of the resultant copolymer and polymerization activity.

The catalyst (d) is used in the range of 0.001 to 10 mol or more preferably 0.001 to 1 mol with respect to 1 mol of the aromatic ether compound (c). A use amount of more than 10 mol extremely increases a polymerization rate, resulting in a decrease in the introduction amount of the end group of the formula (1) as well as a difficulty in the control of the molecular weight distribution.

In the production method for the soluble polyfunctional vinyl aromatic copolymer of the present invention, it is possible to use one or more kinds of co-catalysts selected from ester compounds excluding the aromatic ether compound (c) as desired. In this case, the co-catalyst may be used in the range of less than 90 wt % or more preferably 70 wt % or less in combination with the aromatic ether compound (c) with respect to a solvent. A use amount of the aromatic ether compound (c) and the co-catalyst of more than 90 wt % with respect to a solvent undesirably decreases a polymerization rate and reduces the yield of the copolymer. The combined use of the aromatic ether compound (c) and the co-catalyst facilitates the control of the polarity of the entire polymerization system, and allows for the optimization of the dielectric constant of a solvent, which affects a degree of polymerization, and the control of the reactivity of a polymerization active species. As a result, the molecular weight and molecular weight distribution of the soluble polyfunctional vinyl aromatic copolymer can be controlled more sufficiently.

Further, the polymerization reaction is performed in an organic solvent having a dielectric constant of 2 to 15 and being capable of dissolving a soluble polyfunctional vinyl aromatic copolymer to be produced. The organic solvent is a compound being essentially free of inhibiting cationic polymerization, and being capable of dissolving the catalyst, the polymerization additive, the co-catalyst, the monomer, and the polyfunctional vinyl aromatic copolymer to form a uniform solution. The organic solvent is not particularly limited as long as the organic solvent has a dielectric constant ranging from 2 to 15. One kind of organic solvent may be alone, or two or more kinds thereof may be used in combination. A dielectric constant of the solvent of less than 2 undesirably broadens a molecular weight distribution. A dielectric constant of the solvent of more than 15 remarkably reduces a polymerization rate.

Particularly preferred as the organic solvent are toluene, xylene, n-hexane, cyclohexane, methylcyclohexane, and ethylcyclohexane from the viewpoint of balance between polymerization activity and solubility. Further, in consideration of the viscosity of the resultant polymerization solution and the ease of heat removal, the use amount of the solvent is determined so that the concentration of the copolymer in the polymerization solution at the time of the completion of polymerization is 1 to 80 wt %, preferably 5 to 70 wt %, or particularly preferably 10 to 60 wt %. A concentration of less than 1 wt % reduces polymerization efficiency, which causes an increase in cost. A concentration of more than 80 wt % increases a molecular weight and a molecular weight distribution, which causes a decrease in molding processability.

The polymerization is performed at a temperature of 20 to 120° C. or preferably 40 to 100° C. A polymerization temperature of more than 120° C. reduces reaction selectivity, which causes problems such as an increase in molecular weight distribution and gel generation. A polymerization temperature of less than 20° C. remarkably reduces a catalyst activity, with the result that a catalyst must be added in a large amount.

After the termination of the polymerization reaction, a method of recovering the copolymer is not particularly limited. Examples of the method include methods generally employed such as a steam stripping method and a method involving precipitation in a poor solvent.

According to the production method of the present invention, the soluble polyfunctional vinyl aromatic copolymer of the present invention can be provided advantageously.

The soluble polyfunctional vinyl aromatic copolymer of the present invention can be processed into a molding material, a sheet, or a film, and can satisfy properties such as low permittivity, low water absorption rate, and high heat resistance. In addition, the soluble polyfunctional vinyl aromatic copolymer can be applied to a semiconductor-related material and an optical material, and further, to a paint, a photosensitive material, an adhesive, a sewage treatment agent, a heavy metal scavenger, an ion-exchange resin, an antistatic agent, an antioxidant, an anti-fogging agent, an anti-rust agent, an anti-dyeing agent, a disinfectant, an insecticide, a medical material, a flocculant, a surfactant, a lubricant, a solid fuel binder, a conductive treatment agent, and the like. Further, there is exemplified, as an optical part to which the soluble polyfunctional vinyl aromatic copolymer can be applied, a CD pick-up lens, a DVD pick-up lens, a Fax lens, an LBP lens, a Fresnel lens, a lenticular lens, a micro lens array, a polygon mirror, or a prism.

Next, a resin composition of the present invention is described. First, a photosensitive resin composition of the present invention, a cured product and a hard coat film each obtained from the photosensitive resin composition are described. Then, a curable resin composition of the present invention, and a cured product and an optical material each obtained from the curable resin composition are described.

The photosensitive resin composition of the present invention includes a component (A), a component (B), and a component (C). Here, the component (A) is the above-mentioned soluble polyfunctional vinyl aromatic copolymer, the component (B) is one or more kinds of photocurable polyfunctional (meth)acrylates having at least three (meth)acryloyl groups in the molecule, and the component (C) is a photopolymerization initiator. In addition, the blending amount of the component (A) is 1 to 75 wt %, the blending amount of the component (B) is 98.9 to 10 wt %, and the blending amount of the component (C) is 0.1 to 15 wt %.

The soluble polyfunctional vinyl aromatic copolymer serving as the component (A) and a production method for the soluble polyfunctional vinyl aromatic copolymer are as described in the section of the soluble polyfunctional vinyl aromatic copolymer of the present invention and a production method for the soluble polyfunctional vinyl aromatic copolymer.

The soluble polyfunctional vinyl aromatic copolymer serving as the component (A) is the above-mentioned soluble polyfunctional vinyl aromatic copolymer. Preferred examples of the soluble polyfunctional vinyl aromatic copolymer include a copolymer obtained by allowing the following compounds to react with each other: 5 to 75 mol % of a divinyl aromatic compound; 35 to 5 mol % of a monovinyl aromatic compound; and 60 to 20 mol % of an aromatic ether compound, in which: the copolymer has, at the end, a end group derived from the aromatic ether compound represented by the above-mentioned formula (1), has a number average molecular weight Mn of 500 to 100,000, and has a molecular weight distribution (Mw/Mn) of 100.0 or less, the molecular weight distribution being represented by a ratio of a weight average molecular weight Mw to a number average molecular weight Mn; the introduction amount of the above-mentioned end group is 1.0 (group/molecule) or more; and is soluble in toluene, xylene, tetrahydrofuran, dichloroethane, or chloroform.

The soluble polyfunctional vinyl aromatic copolymer serving as the component (A) has, at the end, a structural unit derived from the aromatic ether compound, and thus gives a photosensitive resin composition that provides a hard coat layer having improved stiffness, adhesion property, and secondary processability such as punching processability.

In the photosensitive resin composition of the present invention, used as the component (B) are one or more kinds of photocurable polyfunctional acrylates having at least three or more (meth)acryloyl groups in the molecule. The combined use of the polyfunctional acrylate used as the component (B) and the component (A) synergistically improves scratch resistance and adhesiveness in a simultaneous manner.

Examples of the photo-curable polyfunctional (meth)acrylate having at least three or more (meth)acryloyl groups in the molecule, which may be used as the component (B), include trimethylolpropane tri(meth)acrylate, trimethylolpropane trioxyethyl(meth)acrylate, tris(2-hydroxyethyl)isocyanurate tri(meth)acrylate, pentaerythritol tri(meth)acrylate, pentaerythritol tetra(meth)acrylate, dipentaerythritol hexa(meth)acrylate, a tri- or more-functional urethane(meth)acrylate, a tri- or more-functional epoxy(meth)acrylate, and a tri- or more-functional polyester(meth)acrylate.

It should be noted that there are exemplified, as commercially available products of polyfunctional monomer having at least three (meth)acryloyl groups in the molecule, KAYARAD DPHA, DPCA-20, DPCA-30, DPCA-60, DPCA-120, D-310, D-330, PET-30, GPO-303, TMPTA, THE-330, and TPA-330 (all of which are manufactured by NIPPON KAYAKU Co., Ltd.), ARONIX M-315 and M-325 (all of which are manufactured by TOAGOSEI CO., LTD.), and TMPTA, TMPEOTA, DPHA, PETA, EBECRYL 1290 K, EBECRYL 5129, KRM 8200, and EBECRYL 8301 (all of which are manufactured by DAICEL-CYTEC Company LTD.).

Of the above-mentioned photocurable polyfunctional (meth)acrylates, for example, pentaerythritol tetra(meth)acrylate and trimethylolpropane tri(meth)acrylate show large improving effects on adhesion property, bending property, and secondary processability through a synergistic action with the component (A) of the present invention.

Examples of the photopolymerization initiator as the component (C) include: benzoins such as benzoin, benzoin ethyl ether, benzoin methyl ether, benzoin propyl ether, and benzoin isobutyl ether; acetophenones such as acetophenone, 2,2-diethoxy-2-phenylacetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexyl phenyl ketone, and 2-methyl-1-[4-(methylthio)phenyl]-2-morpholinopropan-1-one; anthraquinones such as 2-ethylanthraquinone, 2-tertiary-butylanthraquinone, 2-chloroanthraquinone, and 2-amylanthraquinone; thioxanthones such as 2,4-diethylthioxanthone, 2-isopropylthioxanthone, and 2-chlorothioxanthone; ketals such as acetophenone dimethyl ketal and benzyl dimethyl ketal; benzophenones such as benzophenone, 4-benzoyl-4'-methyldiphenyl sulfide, and 4,4'-bismethylaminobenzophenone; and phosphine oxides such as 2,4,6-trimethylbenzoyl-diphenylphosphine oxide and bis(2,4,6-trimethylbenzoyl)-phenylphosphine oxide.

One kind of those photopolymerization initiators may be used alone, or two or more kinds thereof may be used as a mixture. In addition, the photopolymerization initiator may be used in combination with a promoter including a tertiary amine such as triethanolamine or methyldiethanolamine or a benzoic acid derivative such as N,N-dimethylaminobenzoic acid ethyl ester or N,N-dimethylaminobenzoic acid isoamyl ester.

There are exemplified, as commercially available products of the photopolymerization initiator, Irgacure 184, 369, 651, 500, 819, 907, 784, 2959, CGI-1700, -1750, -1850, CG24-61, Darocur 1116, 1173 (all of which are manufactured by Ciba Specialty Chemicals Ltd.), Lucirin TPO, LR8893, LR8970 (all of which are manufactured by BASF), and EBECRYL P36 (manufactured by UCB).

The photosensitive resin composition of the present invention must contain the component (A), the component (B), and the component (C) described above in an amount of component (A): 1 to 75 wt %, component (B): 98.9 to 10 (wt %), and component (C): 0.1 to 15 wt % or preferably component (A): 5 to 60 wt %, component (B): 94 to 30 wt %, and component (C): 1 to 10 wt %, respectively. The blending proportion of the component (A) and the component (B) within the above-mentioned range synergistically improves the adhesiveness, scratch resistance, and secondary processability of the hard coat layer. Further, a use amount of the component (C) of less than 0.1 wt % undesirably causes insufficient curing easily and reduces adhesiveness and scratch resistance. Further, a use amount of the component (C) of more than 15 wt % undesirably reduces punching processability and reduces productivity.

Further, the photosensitive resin composition of the present invention may also contain, as a component (D), 0.1 to 20 wt % of one or more kinds of (meth)acrylate compounds selected from the group consisting of monofunctional and bifunctional (meth)acrylates. Used as the monofunctional or polyfunctional (meth)acrylate compounds of the component (D) are one or more kinds of monofunctional or polyfunctional (meth)acrylate compounds selected from the group consisting of: monofunctional (meth)acrylates such as ethylene oxide-modified phenol(meth)acylate, propylene oxide-modified phenol(meth)acrylate, ethylene oxide-modified nonylphenol(meth)acrylate, propylene oxide-modified nonylphenol(meth)acrylate, 2-ethylhexylcarbitol(meth)acrylate, isobornyl(meth)acrylate, tetrahydrofurfuryl(meth)acrylate, hydroxyethyl(meth)acrylate, hydroxypropyl(meth)acrylate, hydroxybutyl(meth)acrylate, hydroxyhexyl(meth)acrylate, diethylene glycol mono(meth)acrylate, triethylene glycol mono(meth)acrylate, and tripropylene glycol mono(meth) acrylate; polyfunctional (meth)acrylates such as diethylene glycol di(meth)acrylate, triethylene glycol di(meth)acrylate, tetraethylene glycol di(meth)acrylate, dipropylene glycol di(meth)acrylate, tripropylene glycol di(meth)acrylate, tetrapropylene glycol di(meth)acrylate, polypropylene glycol di(meth)acrylate, 1,4-butanediol di(meth)acrylate, neopentyl glycol di(meth)acrylate, 1,6-hexanediol di(meth)acrylate, ethylene oxide-modified neopentyl glycol di(meth)acrylate, ethylene oxide-modified bisphenol A di(meth)acrylate, propylene oxide-modified bisphenol A di(meth)acrylate, ethylene oxide-modified hydrogenated bisphenol A di(meth)acrylate, trimethylolpropane di(meth)acrylate, and trimethylolpropane aryl ether di(meth)acrylate; and various kinds of urethane(meth)acrylate, epoxy(meth)acrylate, polyester(meth)acrylate, and the like. Of those, tetrahydrofurfuryl (meth)acrylate, tetraethylene glycol di(meth)acrylate, and 1,4-butanediol di(meth)acrylate are favorably used because these compounds have high improving effect on punching processability and adhesiveness.

There are exemplified, as commercially available products of the monofunctional or bifunctional (meth)acrylate compounds as the component (D), β-CEA, IBOA, ODA-N, EBECRYL 110, DPGA, HDDA, TPGDA, IRR214-K, EBECRYL 8402, EBECRYL 8200, EBECRYL 8407 (manufactured by DAICEL-CYTEC Company LTD.), SR285, SR213, SR268, CD420, SR203, SR340, SR423D, CD513, SR212, SR259, SR238F, SR601, SR9045 (manufactured by Sartomer Company Inc.), and Light Acrylate PO-A (manufactured by KYOEISHA CHEMICAL Co., LTD).

The photosensitive resin composition of the present invention may be mixed with a diluent serving as a component (E) before use. Here, the component (E) is excluded from components in the case of calculating the composition of the photosensitive resin composition.

Specific examples of the diluent which may be used include: lactones such as γ-butylolactone, γ-valerolactone, γ-caprolactone, γ-heptalactone, α-acetyl-γ-butylolactone, and ∈-caprolactone; ethers such as dioxane, 1,2-dimethoxymethan, diethylene glycol dimethyl ether, diethylene glycol diethyl ether, diethylene glycol dibutyl ether, propylene glycol monomethyl ether, propylene glycol monoethyl ether, triethylene glycol dimethyl ether, triethylene glycol diethyl ether, tetraethylene glycol dimethyl ether, and tetraethylene glycol diethyl ether; carbonates such as ethylene carbonate and propylene carbonate; ketones such as methyl ethyl ketone, methyl isobutyl ketone, cyclohexanone, and acetophenone; phenols such as phenol, cresol, and xylenol; esters such as ethyl acetate, butyl acetate, ethyl cellosolve acetate, butyl cellosolve acetate, carbitol acetate, butyl carbitol acetate, and propylene glycol monomethyl ether acetate; hydrocarbons such as toluene, xylene, diethylbenzene, and cyclohexane; halogenated hydrocarbons such as trichloroethane, tetrachloroethane, and monochlorobenzene; and organic solvents such as petroleum solvents including petroleum ether and petroleum naphtha. One kind of diluent may be used alone, or two or more kinds of thereof may be used in combination.

It is preferred that the blending amount of the component (E) be 5.0 to 500 parts by weight, more preferably 10.0 to 300 parts by weight, or most preferably 20.0 to 100 parts by weight with respect to 100 parts by weight of the photosensitive resin composition including the component (A), the component (B), and the component (C) as essential components. It should be noted that the component (E) is calculated separately from the photosensitive resin composition.

To the photosensitive resin composition of the present invention, a silicone-based compound may be added in an amount of 0.1 to 5.0 (wt %) as desired. Examples of the silicone-based compound which is advantageously used include one or more kinds of silicone-based compounds selected from the group consisting of a silicone-acrylic polymer, an organopolysiloxane, and a polysiloxane having a polymerizable carbon-carbon double bond at one end and/or both ends.

Here, the silicone-acrylic polymer may be obtained by radical copolymerization of a monomer capable of undergoing radical polymerization with acrylic modified silicone. The ratio of silicone in the silicone-acrylic polymer is in the range of generally 10 to 50% by weight, preferably 20 to 40% by weight, or more preferably 20 to 30% by weight. The molecular weight is preferably 50,000 to 100,000. There are exemplified, as commercially available products of the silicone-acrylic polymer, Symac US-270, US-350, US-380, and US-352 (manufactured by Toagosei Co., Ltd.).

To the photosensitive resin composition, as necessary, a leveling agent, an antifoaming agent, further, an ultraviolet absorber, a photostabilizer, various inorganic and organic fillers, a mildewcide, an antimicrobial agent, and the like may be added to impart functionality depending on the respective purposes.

The photosensitive resin composition of the present invention may be obtained by mixing the component (A), the component (B), and the component (C), and as necessary, the component (D) and the component (E) described above, and any other component with each other in any suitable order. The photosensitive resin composition is time-dependently stable.

The photosensitive resin composition of the present invention is suitable for a photosensitive resin composition for hard coating. When the photosensitive resin composition of the present invention is used as a hard coat agent, the photosensitive resin composition is also referred to as a photosensitive resin composition for hard coating.

A film or sheet having a hard coat layer of the present invention has the above-mentioned photosensitive resin composition for a hard coat agent on a film or sheet substrate (referring to a base film or sheet to be subjected to hard coat processing, and hereinafter, referred to as a substrate or a substrate film). The photosensitive resin composition for a hard coat agent has a weight after drying of 2 to 50 g/m² or preferably 5 to 30 g/m², or a thickness after drying of 2 to 50 μm or preferably 5 to 30 μm.

There are exemplified, as resins of which the substrate films, on each of which a hard coated layer are to be provided, are formed, polyester, polypropylene, polyethylene, polyacrylate, MS, polycarbonate, triacetyl cellulose, polyethersulfone, and a cycloolefin-based polymer. The thickness of the substrate films is not particularly limited and the thickness is preferably 50 μm to 550 mm.

There are exemplified, as methods of applying the photosensitive resin composition for a hard coat agent onto the surface of substrate films, bar coater coating, Meyer bar coating, air knife coating, gravure coating, reverse gravure coating, offset printing, flexographic printing, and screen printing. A substrate film having a design or a substrate film provided with an easy adhesion layer may be used as the substrate films. However, a substrate film provided with no easy adhesion layer is preferred in view of cost.

There are exemplified, as light for curing the photosensitive composition for a hard coat agent, ultraviolet rays and electron beams. Further, in the case of curing with ultraviolet rays, an ultraviolet ray irradiation apparatus having a xenon lamp, a high-pressure mercury lamp, a metal halide lamp, or the like is used as a light source, and a light amount, a light source layout, and the like are adjusted as appropriate. In the case of using the metal halide lamp, the photosensitive composition for a hard coat agent is preferably cured at a transport rate of 2 to 60 m/min for one lamp having a light amount of 200 to 600 mW/cm².

As for the photosensitive resin composition for a hard coat agent used for providing a hard coated film or sheet of the present invention, the component (A) and the component (B) in the photosensitive resin composition for a hard coat agent of the present invention synergistically enhance an interfacial interaction particularly on an untreated film or sheet (substrate) made of polyester, an acrylic resin, an MS resin, polyether sulfone, triacetylcellulose, or the like. Thus, the adhesiveness to a film or sheet (substrate) is improved, and the bending property, scratch resistance, and pencil hardness of a hard coat layer obtained by curing are excellent. The photosensitive resin composition is excellent in adhesion property to an untreated film or sheet, and can be used to produce a film provided with a hard coat layer at low cost. The resultant film or sheet provided with a hard coat layer can be suitably used for applications in an optical field and an electronic field. Such film or sheet provided with a hard coat layer is particularly suitable for fields of instruments requiring high hardness and low reflection, such as plastic optical parts, touch panels, flat displays, and film liquid crystal devices.

Next, the curable resin composition of the present invention is described. The curable resin composition contains the component (A) and the component (F). Here, the component (A) is the above-mentioned soluble polyfunctional vinyl aromatic copolymer, and the component (F) is one or more kinds of polymerizable unsaturated monomers having a cycloalkyl group and having one or two (meth)acryloyl groups in the molecule. The blending amount of the component (A) in the curable resin composition is 1 to 80 wt %, and the blending amount of the component (F) is 99 to 20 wt %. The curable resin composition is suitable for an optical material, and hence is also referred to as a curable optical resin composition.

The soluble polyfunctional vinyl aromatic copolymer serving as the component (A) and a production method for the soluble polyfunctional vinyl aromatic copolymer are as described in the section of the soluble polyfunctional vinyl aromatic copolymer of the present invention and a production method for the soluble polyfunctional vinyl aromatic copolymer.

The soluble polyfunctional vinyl aromatic copolymer serving as the component (A) is the above-mentioned soluble polyfunctional vinyl aromatic copolymer. Preferred examples of the soluble polyfunctional vinyl aromatic copolymer include a copolymer obtained by allowing the following compounds to react with each other: 5 to 75 mol % of a divinyl aromatic compound; 35 to 5 mol % of a monovinyl aromatic compound; and 60 to 20 mol % of an aromatic ether compound, in which: the copolymer has, at the end, a end group derived from the aromatic ether compound represented by the above-mentioned formula (1), has a number average molecular weight Mn of 500 to 100,000, and has a molecular weight distribution (Mw/Mn) of 100.0 or less, the molecular weight distribution being represented by a ratio of a weight average molecular weight Mw to a number average molecular weight Mn; the introduction amount of the above-mentioned end group is 1.0 (group/molecule) or more; and is soluble in toluene, xylene, tetrahydrofuran, dichloroethane, or chloroform. Further, in the soluble polyfunctional vinyl aromatic copolymer, it is desirable that the molar fraction a' of the structural unit derived from the divinyl aromatic compound, the molar fraction b' of the structural unit derived from the monovinyl aromatic compound, and the molar fraction c' of the structural unit derived from the aromatic ether compound satisfy the following inequalities:

$$0.1 \leq a'/(a'+b') \leq 0.95$$

$$0.005 \leq c'(a'+b')\} < 2.0$$

In the curable resin composition of the present invention, used as the component (F) are one or more kinds of polymerizable unsaturated monomers having a cycloalkyl group and having one or two (meth)acryloyl groups in the molecule. The combined use of those polymerizable unsaturated monomers to be used as the component (F) and the component (A) synergistically improves the mold transfer property during molding, mold release property, and adhesiveness to a hard coat agent in a simultaneous manner.

Preferred examples of the polymerizable unsaturated monomers which may be used as the component (F) include, but are not limited to, polymerizable unsaturated monomers represented by the following general formulae (11) to (17).

Preferred specific examples of the polymerizable unsaturated monomer include at least one kind of polymerizable unsaturated monomer selected from the group consisting of dicyclopentanyl(meth)acrylate represented by the following general formula (11), a dicyclopentanyloxyalkyl(meth)acrylate represented by the following general formula (12), dicyclopentenyl(meth)acrylate represented by the following general formula (13), dicyclopentenyloxyalkyl(meth)acrylate represented by the following general formula (14), isobornyl (meth)acrylate represented by the following general formula (15), a isobornyloxyalkyl(meth)acrylate represented by the following general formula (16), and tricyclodecane dimethanol di(meth)acrylate represented by the following general formula (17).

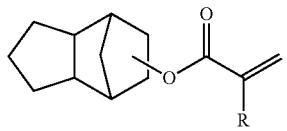
(11)

In the formula, R represents hydrogen or a methyl group.

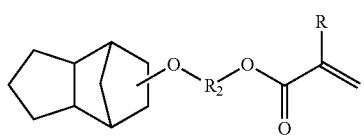
(12)

In the formula: R represents hydrogen or a methyl group; $R_2$ represents an alkylene group having 2 to 12 carbon atoms or an oxyalkylene group having a total of 4 to 12 carbon atoms in which two or more alkylene groups having at least two carbon atoms are bonded to each other via an oxygen atom.

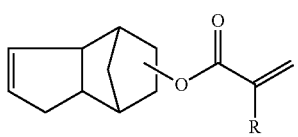
(13)

In the formula, R represents hydrogen or a methyl group.

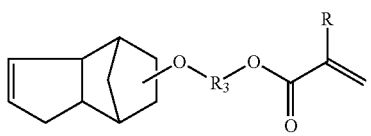
(14)

In the formula: R represents hydrogen or a methyl group; $R_3$ represents an alkylene group having 2 to 12 carbon atoms or an oxyalkylene group having a total of 4 to 12 carbon atoms in which two or more alkylene groups having at least two carbon atoms are bonded to each other via an oxygen atom.

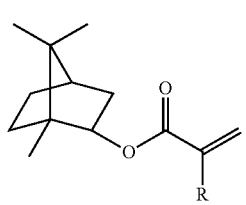
(15)

In the formula, R represents hydrogen or a methyl group.

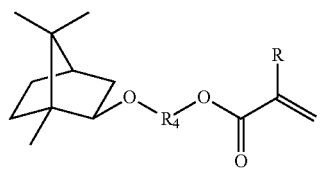
(16)

In the formula: R represents hydrogen or a methyl group; $R_4$ represents an alkylene group having 2 to 12 carbon atoms or an oxyalkylene group having a total of 4 to 12 carbon atoms in which two or more alkylene groups having at least two carbon atoms are bonded to each other via an oxygen atom.

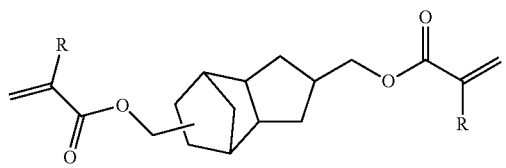
(17)

In the formula, R represents hydrogen or a methyl group.

Specific examples of the polymerizable unsaturated monomer which may be used as the component (B) are described. For example, there are given dicyclopentanyl acrylate, dicyclopentanyl methacrylate, dicyclopentanyloxyethyl acrylate, dicyclopentanyloxyethyl methacrylate, dicyclopentenyl acrylate, dicyclopentenyl methacrylate, dicyclopentenyloxyethyl acrylate, dicyclopentenyloxyethyl methacrylate, isobonyl acrylate, isobonyl methacrylate, isobonyloxyethyl acrylate, isobonyloxyethyl methacrylate, tricyclodecane dimethanol diacrylate, and tricyclodecane dimethanol dimethacrylate.

It should be noted that there are exemplified, as commercially available products of one or more kinds of polymerizable unsaturated monomers having a cycloalkyl group and having one or two (meth)acryloyl groups in the molecule, FA-511AS, FA-512A, FA-512AS, FA-513AS, FA-512M, FA-512MT, and FA-513M (all of which are manufactured by Hitachi Chemical Company, Ltd.), IBOA (Daicel-Cytec Company, Ltd.), and SR423D, SR506D, and SR833 (all of which are from Sartomer Japan Inc.).

Of the above-mentioned polymerizable unsaturated monomers, dicyclopentanyl acrylate, dicyclopentenyl acrylate, and tricyclodecane dimethanol diacrylate are preferred from the viewpoints of providing large improving effects on mold transfer property and mold release property through a synergistic action with the component (A). Further, one kind or two or more kinds of those polymerizable unsaturated monomers may be used.

The curable resin composition of the present invention advantageously contains at least one kind selected from the following components (G) to (I) in addition to the above-mentioned components.

A polymerization initiator as a component (G). The content is 0.01 to 15 wt % based on the sum of the component (A) and the component (F). A polyfunctional thiol compound as a component (H). The content is 0.5 to 40 wt % with respect to the curable resin composition. A polymerizable unsaturated monomer having 1 to 10 (meth)acryloyl groups excluding the component (F) as a component (I). The content is 1 to 40 wt % with respect to the curable resin composition.

The curable resin composition of the present invention is cured by undergoing a crosslinking reaction by means of heating, irradiation with active energy rays, or the like as described below. In that case, the reaction temperature may be reduced, or the polymerization initiator (G) may be incorporated before use for the purpose of promoting a crosslinking reaction of unsaturated groups. The amount of the polymerization initiator used for that purpose is 0.01 to 15 wt %, preferably 0.02 to 12 wt %, or particularly preferably 0.05 to 10 wt % based on the sum of the component (A) and the component (F). It is preferred that the amount of the polymerization initiator fall within the above-mentioned range because a cured product excellent in mold release property, heat resistance, and mechanical characteristics is obtained.

A compound which may be used for the polymerization initiator as the component (G) is not particularly limited as long as the compound generates a radical by means of heating, irradiation with active energy rays, or the like. To be more specific, for example, in the case of curing with heating, it is possible to use all compounds which may be generally used in radical thermal polymerization, such as an azo-based initiator and a peroxide initiator. Examples of the azo-based initiator include azobisisobutylonitrile, azobis-4-methoxy-2,4-dimethylvaleronitrile, azobiscyclohexanone-1-carbonitrile, and azodibenzoyl, and examples of the peroxide initiator include benzoyl peroxide, lauroyl peroxide, di-t-butyl peroxyhexahydroterephtalate, t-butyl peroxy-2-ethylhexanoate, 1,1-t-butylperoxy-3,3,5-trimethyl cyclohexane, tert-butyl peroxy-2-ethylhexylcarbonate, t-butyl peroxyisopropylcarbonate.

When radical polymerization is performed by photo radical polymerization, a photo radical polymerization initiator may be used as a radical polymerization initiator in place of a radical thermal polymerization initiator such as the azo-based initiator or the peroxide initiator as described above. The photo radical polymerization initiator is not particularly limited as long as the photo radical polymerization initiator can efficiently absorb ultraviolet rays from industrial UV irradiation apparatuses to activate, and does not yellow curable resins. Examples of such photo radical polymerization initiator include: benzoins such as benzoin, benzoin methyl ether, benzoin ethyl ether, benzoin propyl ether, and benzoin isobutyl ether; acetophenones such as acetophenone, 2,2-diethoxy-2-phenylacetophenone, 2,2-diethoxy-2-phenylacetophenone, 1,1-dichloroacetophenone, 2-hydroxy-2-methylphenylpropan-1-one, diethoxyacetophenone, 1-hydroxycyclohexyl phenyl ketone, and 2-methyl-1-[4-(methylthio)phenyl]-2-morpholinopropan-1-one; anthraquinones such as 2-ethylanthraquinone, 2-tertiary-butylanthraquinone, 2-chloroanthraquinone, and 2-amylanthraquinone; thioxanthones such as 2,4-diethylthioxanthone, 2-isopropylthioxanthone, and 2-chlorothioxanthone; ketals such as acetophenone dimethyl ketal and benzyl dimethyl ketal; benzophenones such as benzophenone, 4-benzoyl-4'-methyldiphenyl sulfide, and 4,4'-bismethylaminobenzophenone; and phosphine oxides such as 2,4,6-trimethylbenzoyldiphenylphosphine oxide and bis(2,4,6-trimethylbenzoyl)-phenylphosphine oxide.

One kind of photo radical polymerization initiator may be used alone, or two or more kinds thereof may be used in combination. Further, the photo radical polymerization initiator may be used in combination with a promoter such as a tertiary amine such as triethanolamine or methyldiethanolamine or a benzoic acid derivative such as ethyl N,N-dimethylaminobenzoate or isoamyl N,N-dimethylaminobenzoate.

There are exemplified, as commercially available products of the radical thermal polymerization initiator, Perbutyl O, PERLOYL TCP, PERLOYL L, PEROCTA O, NYPER BW, PERHEXYL I, PERHEXA 25Z, Perbutyl P, Perbutyl Z (all of which are manufactured by NOF CORPORATION), V-70, V-65, V-59, and V-40 (all of which are manufactured by Wako Pure Chemical Industries, Ltd.).

There are exemplified, as commercially available products of the photo radical polymerization initiator, Irgacure 184, 369, 651, 500, 819, 907, 784, 2959, CGI-1700, -1750, -1850, CG24-61, Darocur 1116, 1173 (all of which are manufactured by Ciba Specialty Chemicals Ltd.), Lucirin TPO, LR8893, LR8970 (all of which are manufactured by BASF Japan Ltd.), and Ebecryl P36 (manufactured by UCB).

Further, the curable resin composition of the present invention may be blended with one or more kinds of polyfunctional thiols as the component (H). It is recommended that the blending amount in the case of blending the component (H) should be 0.5 to 40 wt %, preferably 1 to 25 wt %, or more preferably 2 to 15 wt % with respect to the composition. A blending amount of the component (H) of less than 0.5 wt % provides an insufficient degree of improvement in mold transfer property and heat resistance through the addition of the polyfunctional thiol. A blending amount of more than 40 wt % remarkably reduces mechanical strength.

Used as the polyfunctional thiol compound as the component (H) are one or more kinds of the polyfunctional thiol compounds selected from the group consisting of trimethylolpropane tris(3-mercaptopropionate), pentaerythritol tetrakis(3-mercaptopropionate), tetraethylene glycol bis(3-mercaptopropionate), dipentaerythritol hexakis(3-mercaptopropionate), pentaerythritol tetrakis(thioglycolate), tris[(3-mercaptopropionyloxy)-ethyl]-isocyanurate), 1,4-bis(3-mercaptobutylyloxy)butane, 1,3,5-tris(3-mercaptobutyloxyethyl)-1,3,5-triazine-2,4,6(1H,3H,5H)-trione, pentaerythritol tetrakis(3-mercaptobutylate), and the like. Of those, pentaerythritol tetrakis(3-mercaptopropionate) is preferably used.

There are exemplified, as commercially available products of the polyfunctional thiol as the component (H), TEMPIC, TMMP, PEMP, and DPMP (all of which are manufactured by SAKAI CHEMICAL INDUSTRY CO., LTD.), Karenz MT BD1, and Karenz MT NR1 and Karenz MT PE1 (all of which are manufactured by SHOWA DENKO K.K.).

Further, in order, for example, to improve adhesiveness to a substrate and to adjust a refractive index, the curable resin composition of the present invention may be blended with one or more kinds of (meth)acrylate compounds selected from the group consisting of compounds having 1 to 10 (meth)acryloyl groups excluding the component (F), as the component (I).

It is recommended that the blending amount in the case of blending the component (I) should be 1.0 to 40 wt %, preferably 2.0 to 35 wt %, or more preferably 5.0 to 30 wt % with respect to the composition. A blending amount of the component (I) of less than 1.0 wt % undesirably provides an insufficient modifying effect through the addition of one or more kinds of (meth)acrylate compounds selected from the group consisting of (meth)acrylates excluding the component (B). A blending amount of more than 40 wt % undesirably reduces mold transfer property and mold release property as the original object of the present invention to a remarkable extent.

Used as the (meth)acrylate compounds as the component (I) are one or more kinds of monofunctional or polyfunctional (meth)acrylate compounds selected from the group consisting of: monofunctional (meth)acrylates such as ethylene oxide-modified phenol(meth)acylate, propylene oxide-modified phenol(meth)acrylate, ethylene oxide-modified nonylphenol(meth)acrylate, propylene oxide-modified nonylphenol(meth)acrylate, urethane(meth)acrylate, epoxy (meth)acrylate, polyester (meth)acrylate, 2-ethylhexylcarbitol(meth)acrylate, tetrahydrofurfuryl (meth)acrylate, hydroxyethyl(meth)acrylate, hydroxypropyl (meth)acrylate, hydroxybutyl(meth)acrylate, hydroxyhexyl(meth)acrylate, diethylene glycol mono(meth)acrylate, triethylene glycol mono(meth)acrylate, and tripropylene glycol mono(meth)acrylate; polyfunctional (meth)acrylates such as diethylene glycol di(meth)acrylate, triethylene glycol di(meth)acrylate, tetraethylene glycol di(meth)acrylate, dipropylene glycol di(meth)acrylate, tripropylene glycol di(meth)acrylate, tetrapropylene glycol di(meth)acrylate, polypropylene glycol di(meth)acrylate, 1,4-butanediol di(meth)acrylate, neopentyl glycol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, ethylene oxide-modified neopentyl glycol di(meth)acrylate, ethylene oxide-modified bisphenol A di(meth)acrylate, propylene oxide-modified bisphenol A di(meth)acrylate, ethylene oxide-modified hydrogenated bisphenol A di(meth)acrylate, trimethylolpropane di(meth)acrylate, and trimethylolpropane aryl ether di(meth)acrylate; 2-acryloyloxyethyl phthalate; 2-acryloyloxyethyl succinate; and 2-acryloyloxyethyl hexahydrophthalate.

There are exemplified, as commercially available products of the (meth)acrylate compounds as the component (I), β-CEA, IBOA, ODA-N, EBECRYL 110, DPGA, HDDA, TPGDA, IRR214-K, EBECRYL 8402, EBECRYL 1290K, EBECRYL 5129, EBECRYL 8200, KRM8200, EBECRYL 8301, EBECRYL 8407 (manufactured by DAICEL-CYTEC Company LTD.), SR285, SR213, SR268, CD420, SR203, SR340, SR423D, CD513, SR212, SR259, SR238F, SR601, SR9045, CN902J75, CN970A60, CN971A80, CN975, CN997, CN9165 (manufactured by Sartomer Company Inc.), and Light Acrylate PO-A, Light Acrylate 1,6HX-A, Light Acrylate 1,9ND-A, Light Acrylate BEPG-A, and Light Ester NP (manufactured by KYOEISHA CHEMICAL Co., LTD).

The polymerizable unsaturated monomer having 1 to 10 (meth)acryloyl groups excluding the component (F), or preferably a (meth)acrylate compound, to be used as the above-mentioned component (I) may be appropriately selected before use depending on the modifying purposes, and it is impossible to specify a suitable compound flatly. Examples of the compound include compounds having a large improving effect on adhesiveness to a poorly adhesive resin substrate and a large improving effect on stiffness of a cured product, such as tetrahydrofurfuryl(meth)acrylate, 1,6-hexanediol di(meth)acrylate, 2-butyl-2-ethyl-1,3-propanediol di(meth)acrylate, 1,9-nonanediol di(meth)acrylate, and urethane (meth)acrylate.

Various kinds of additives excluding the above-mentioned components may be added to the curable resin composition of the present invention as required. Examples of the additives include an antioxidant, a UV absorber, a photostabilizer, a silane coupling agent, a coating surface improver, a thermal polymerization inhibitor, a leveling agent, a surfactant, a coloring agent, a storage stabilizer, a plasticizer, a lubricant, a release agent, a solvent, a filler, an anti-aging agent, and a wettability improver.

Here, examples of the antioxidant include Irganox1010, 1035, 1076, 1222 (all of which are manufactured by Ciba Specialty Chemicals Ltd.), Antigen P, 3C, FR, and GA-80 (manufactured by Sumitomo Chemical Co., Ltd.).

Examples of the UV absorber include Tinuvin P, 234, 320, 326, 327, 328, 329, 213 (all of which are manufactured by Ciba Specialty Chemicals Ltd.), Seesorb102, 103, 110, 501, 202, 712, and 704 (all of which are manufactured by SHIPRO KASEI KAISA, Ltd.).

Examples of the photostabilizer include Tinuvin 292, 144, 622LD (all of which are manufactured by Ciba Specialty Chemicals Ltd.), Sanol LS 770 (manufactured by Sankyosha Co., Ltd.), and Sumisorb TM-061 (manufactured by Sumitomo Chemical Co., Ltd.).

Examples of the silane coupling agent include γ-aminopropyltriethoxysilane, γ-mercaptopropyltrimethoxysilane, and γ-methacryloxypropyltrimethoxysilane. There are exemplified, as commercially available products of the silane coupling agent, SH6062, 6030 (both manufactured by Dow Corning Toray Co., Ltd.), KBE903, 603, and 403 (all of which are manufactured by Shin-Etsu Chemical Co., Ltd.).

Examples of the coating surface improver include silicone additives such as dimethylsiloxane polyether. There are exemplified, as commercially available products of the coating surface improver, DC-57, DC-190 (both manufactured by Dow Corning Corporation.), SH-28PA, SH-29PA, SH-30PA, SH-190 (all of which are manufactured by Dow Corning Toray Co., Ltd.), KF351, KF352, KF353, KF354 (all of which are manufactured by Shin-Etsu Chemical Co., Ltd.), L-700, L-7002, L-7500, and FK-024-90 (all of which are manufactured by Nippon Unicar Company Limited).

The curable resin composition of the present invention may be cured with heat and/or ultraviolet rays depending on the use purposes, applications, and product shapes.

In the case of curing with heat, it is desirable to perform a heating treatment in an oven at preferably 50 to 200° C. or more preferably 80 to 180° C. for 1 minute to 20 hours from the viewpoints of storage stability of the composition and prevention of a cured product from coloring. When the composition contains a solvent, it is desirable to remove the solvent completely before curing. A removal method is not particularly limited, and the solvent is preferably removed by blowing hot air at 50 to 100° C. onto a coated surface for 15 minutes to 2 hours.

The curable resin composition of the present invention may be irradiated with active energy rays such as ultraviolet rays to afford a cured product. Here, specific examples of the light source to be used in the case of curing the curable resin composition by irradiation with active energy rays such as ultraviolet rays include a xenon lamp, a carbon arc, a germicidal lamp, a fluorescent lamp for ultraviolet rays, a high-pressure mercury lamp for copying, a medium-pressure mercury lamp, a high-pressure mercury lamp, an ultra high-pressure mercury lamp, an electrodeless lamp, a metal halide lamp, or electron beams from scanning-type and curtain-type electron beam accelerators. Further, in the case of curing the curable resin composition by irradiation with ultraviolet rays, the irradiation amount of ultraviolet rays required for curing may be about 300 to 3000 mJ/cm$^2$. It should be noted that, in order to cure the curable resin composition sufficiently, the irradiation with active energy rays such as ultraviolet rays is desirably performed in an atmosphere of inert gas such as nitrogen gas.

The curable resin composition of the present invention is a curable optical resin composition suitable for an optical material. Thus, the curable resin composition of the present invention may be cured and molded to afford an optical material such as a lens. There is exemplified, as a production method for a plastic lens using the curable resin composition of the present invention, a method involving producing a mold prepared from a gasket formed of polyvinyl chloride or an ethylene vinyl acetate copolymer and two glass casting molds each having a desired shape, injecting the curable resin composition of the present invention into the mold, curing the curable resin composition by irradiation with active energy rays such as ultraviolet rays, and releasing the cured product from the mold.

Further, it is also possible to: apply the curable resin composition of the present invention onto, for example, a stamper having a shape of a prism, a Fresnel lens, or a lenticular lens to provide a layer of the resin composition; adhere a back sheet (e.g., a substrate or a film made of polymethacrylate, polycarbonate, polystyrene, polyester, or a blend of those polymers) as a hard transparent substrate onto the layer; cure the resin composition by irradiation with ultraviolet rays using a high-pressure mercury lamp or the like from the side of the hard transparent substrate; and then release the cured product from the stamper.

The curable resin composition of the present invention is useful as materials for an optical plastic lens such as a spectacle lens, a Fresnel lens, a lenticular lens, a prism lens sheet for TFT, and an aspheric lens, and further, can be used for applications for optoelectronics such as an optical disk, an optical fiber, and an optical waveguide, print inks, coating materials, clear coating agents, and gross varnishes.

When the curable resin composition of the present invention is used for applications excluding producing cast products such as a plastic lens, the curable resin composition can also be applied to a substrate before use. There are used, as coating methods for the curable resin composition of the present invention to substrates, a direct coating method by brushing, a bar coater, an applicator, a roll coater, or a roller brush, a spray coating method using an air spray or an airless spray coating machine, a flow coating method using a shower coater or a curtain flow coater, a dipping method, a casting method, and a spinner coating method. It should be noted that those coating methods are desirably selected depending on the qualities and shapes of substrates, or applications.

EXAMPLES

Next, the present invention is described by way of examples. However, the present invention is not limited to these examples. It should be noted that any part(s) in the examples represents part(s) by weight. Further, measurement of softening temperature and the like in the examples and sample preparation were performed through methods described below.

1) Molecular Weight and Molecular Weight Distribution of Polymer

Measurement of a molecular weight and a molecular weight distribution of a soluble polyfunctional aromatic copolymer was performed by using GPC (HLC-8120GPC, manufactured by Tosoh Corporation), tetrahydrofuran as a solvent at a flow rate of 1.0 ml/min and a column temperature of 38° C., and a calibration curve of monodisperse polystyrene.

2) Structure of Polymer

A structure of the copolymer was determined through $^{13}$C-NMR and $^{1}$H-NMR analysis by using a nuclear magnetic resonance spectrometer JNM-LA600 manufactured by JOEL Ltd. Chloroform-$d_1$ was used as a solvent, and a resonance line of tetramethylsilan was used as an internal standard.

3) End Group Analysis

As for end group calculation, the number of end groups contained in one molecule of a soluble polyfunctional vinyl aromatic copolymer having a end group was calculated based on the number average molecular weight obtained by the above-mentioned GPC measurement and the amount of a derivative used for introducing the end group with respect to the total amount of monomers obtained from the results of $^{1}$H-NMR measurement and elementary analysis.

4) Preparation of Sample for Measurement of Glass Transition Temperature (Tg) and Softening Temperature of Cured Product and Measurement A solution of a soluble polyfunctional vinyl aromatic copolymer was uniformly applied onto a glass substrate so as to have a thickness after drying of 20 µm, heated at 90° C. for 30 minutes using a hot plate, and dried. The resultant resin film was set in a thermomechanical analyzer (TMA) together with the glass substrate. The temperature was increased to 220° C. at a temperature increasing rate of 10° C./min in a stream of nitrogen. Then, a heating treatment was performed at 220° C. for 20 minutes to remove a remaining solvent and cure the soluble polyfunctional vinyl aromatic copolymer. The glass substrate was cooled to room temperature. After that, a probe for analysis was brought into contact with a sample in a TMA measurement apparatus. Scanning measurement was performed from 30° C. to 360° C. at a temperature increasing rate of 10° C./min in a stream of nitrogen. Then, a softening temperature was determined by a tangent method.

5) Heat Resistance Evaluation and Heat Discoloration Resistance Measurement

The copolymer was set in a thermogravimetric analysis (TGA) measurement apparatus. Scanning measurement was performed from 30° C. to 320° C. at a temperature increasing rate of 10° C./min in a stream of nitrogen. A weight loss at 300° C. was determined as heat resistance. A discoloration amount in a sample after measurement was visually observed to evaluate the heat discoloration resistance based on the following criteria: A: no heat discoloration; B: pale yellow; C: brown; and D: black.

It should be noted that the heat discoloration resistance was evaluated as described below in Examples 1 to 4 and Comparative Examples 1 to 5. 5.0 g of the soluble polyfunctional vinyl aromatic copolymer, 5.0 g of 2-phenoxyethyl methacrylate, and 0.02 g of t-butyl peroxy-2-ethylhexanoate (Perbutyl O manufactured by NOF CORPORATION) were mixed with each other and heated at 150° C. for 1 hour in a stream of nitrogen to afford a cured product. Then, the discoloration amount of the resultant cured product was visually observed to perform an evaluation based on the following criteria: ○: no heat discoloration; Δ: pale yellow; and ×: yellow.

6) Compatibility Measurement

The compatibility of the soluble polyfunctional vinyl aromatic copolymer with an acrylate compound was measured as described below. That is, 2 g of a sample were dissolved in 10 g of acrylates (pentaerythritol tetraacrylate (PETA) and trimethylolpropane triacrylate (TMPTA)). The transparency of the dissolved sample was visually observed to evaluate the compatibility based on the following criteria: ○: transparent; Δ: translucent; and ×: opaque or not dissolved.

Example 1

2.03 mol (288.5 mL) of divinylbenzene, 0.084 mol (12.0 mL) of ethylvinylbenzene, 2.11 mol (241.7 mL) of styrene, 2.25 mol (427.3 mL) of 2-phenoxyethyl methacrylate, 100.0 mL of butyl acetate, and 1150 mL of toluene were loaded into a 3.0-L reaction vessel. To the reaction vessel were added 300 mmol of boron trifluoride diethyl ether complex at 50° C. The mixture was subjected to a reaction for 4 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 277.4 g of a copolymer A.

The resultant copolymer A had Mn of 2020, Mw of 5170, and Mw/Mn of 2.56. $^{13}$C-NMR and $^1$H-NMR analyses confirmed that the copolymer A had a resonance line derived from the 2-phenoxyethyl methacrylate end. The elementary analysis results of the copolymer A were C: 87.1 wt %, H: 7.5 wt %, and O: 5.3 wt %. The introduction amount (c1) of a structural unit derived from 2-phenoxyethyl methacrylate in the soluble polyfunctional vinyl aromatic polymer was 2.2 (groups/molecule), the amount being calculated based on the elementary analysis results and the number average molecular weight in terms of standard polystyrene. Further, the copolymer contained 59.5 mol % of a structural unit derived from divinylbenzene and a total of 40.5 mol % of structural units derived from styrene and ethylbenzene (excluding a end structural unit). The content of a vinyl group in the copolymer A was 35.7 mol %.

Further, the TMA measurement results of the cured product confirmed that there was no clear Tg and the softening temperature was 300° C. or more. The TGA measurement results confirmed that the weight loss at 300° C. was 0.09 wt % and the heat discoloration resistance was evaluated as ○. Meanwhile, the compatibility was evaluated as PETA: ○ and TMPTA: ○.

Example 2

1.152 mol (164.2 mL) of divinylbenzene, 0.048 mol (6.8 mL) of ethylvinylbenzene, 1.20 mol (137.5 mL) of styrene, 1.80 mol (341.83 mL) of 2-phenoxyethyl methacrylate, 8.0 mL of butyl acetate, and 792 mL of toluene were loaded into a 2.0-L reaction vessel. To the reaction vessel were added 200 mmol of boron trifluoride diethyl ether complex at 50° C. The mixture was subjected to a reaction for 6.5 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 339.8 g of a copolymer B.

The resultant copolymer B had Mn of 1990, Mw of 8580, and Mw/Mn of 4.32. The elementary analysis results of the copolymer B were C: 84.1 wt %, H: 7.5 wt %, and O: 8.5 wt %. The introduction amount (c1) of a structural unit derived from 2-phenoxyethyl methacrylate was 3.5 (groups/molecule). Further, the copolymer contained 58.4 mol % of a structural unit derived from divinylbenzene and a total of 41.6 mol % of structural units derived from styrene and ethylbenzene. The content of a vinyl group in the copolymer B was 9.9 mol %. Further, no clear Tg was observed, the softening temperature was 300° C. or more, the weight loss at 300° C. was 0.13 wt %, and the heat discoloration resistance was evaluated as ○.

Example 3

2.03 mol (288.5 mL) of divinylbenzene, 0.084 mol (12.0 mL) of ethylvinylbenzene, 2.11 mol (241.7 mL) of styrene, 2.74 mol (520.7 mL) of 2-phenoxyethyl methacrylate, 100.0 mL of butyl acetate, and 1150 mL of toluene were loaded into a 3.0-L reaction vessel. To the reaction vessel were added 300 mmol of boron trifluoride diethyl ether complex at 50° C. The mixture was subjected to a reaction for 5.0 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 241.8 g of a copolymer C.

The resultant copolymer C had Mn of 2690, Mw of 5160, and Mw/Mn of 1.92. The elementary analysis results of the copolymer C were C: 87.0 wt %, H: 7.5 wt %, and O: 5.6 wt %. The introduction amount (c1) of a structural unit derived from 2-phenoxyethyl methacrylate was 2.9 (groups/molecule). Further, the copolymer contained 57.9 mol % of a structural unit derived from divinylbenzene and a total of 42.1 mol % of structural units derived from styrene and ethylbenzene. The content of a vinyl group in the copolymer C was 31.8 mol %. Further, no clear Tg was observed, the softening temperature was 300° C. or more, the weight loss at 300° C. was 0.15 wt %, and the heat discoloration resistance was evaluated as ○.

Example 4

1.92 mol (273.5 mL) of divinylbenzene, 0.08 mol (11.4 mL) of ethylvinylbenzene, 2.0 mol (229.2 mL) of styrene, 2.00 mol (348.1 mL) of 2-phenoxyethyl acrylate, 250.0 mL of butyl acetate, and 1000 mL of toluene were loaded into a 3.0-L reaction vessel. To the reaction vessel were added 80 mmol of boron trifluoride diethyl ether complex at 70° C. The mixture was subjected to a reaction for 6 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 164.2 g of a copolymer L.

The resultant copolymer L had Mn of 2310, Mw of 4960, and Mw/Mn of 2.15. The elementary analysis results of the copolymer L were C: 84.5 wt %, H: 7.3 wt %, and O: 7.9 wt %. The introduction amount (c1) of a structural unit derived from 2-phenoxyethyl acrylate was 3.6 (groups/molecule). Further, the copolymer contained 54.8 mol % of a structural unit derived from divinylbenzene and a total of 45.2 mol % of structural units derived from styrene and ethylbenzene. The content of a vinyl group in the copolymer was 21.9 mol %. Further, no clear Tg of a cured product was observed, the softening temperature was 300° C. or more, the weight loss at 300° C. was 0.09 wt %, and the heat discoloration resistance was evaluated as ○.

All of the copolymers A to C and L were soluble in toluene, xylene, THF, dichloroethane, dichloromethane, or chloroform, and did not form any gel. Further, in all of the copolymers, the compatibility was evaluated as PETA: ○ and TMPTA: ○.

Comparative Example 1

32.4 mol (4618 mL) of divinylbenzene, 1.35 mol (192 mL) of ethylvinylbenzene, 11.3 mol (1291 mL) of styrene, 1.8 mol (175.5 mL) of ethyl acetate, 13.5 mol (1648.5 g) of 2,6-xylenol, and 14.7 L of toluene were loaded into a 30-L reaction vessel. To the reaction vessel were added 120 mmol of boron trifluoride diethyl ether complex at 70° C. The mixture was subjected to a reaction for 2 hours. After the polymerization solution had been terminated with 65.9 mL of 1-butanol, the reaction mixture solution was charged into a large amount of n-hexane at room temperature to precipitate a polymer. The resultant polymer was washed with n-hexane, separated by filtration, dried, and weighed to afford 3948 g of a copolymer D.

The resultant copolymer D had Mn of 2820, Mw of 10800, and Mw/Mn of 3.84. $^{13}$C-NMR and $^{1}$H-NMR analyses confirmed that the copolymer D had a resonance line derived from the 2,6-xylenol end. The elementary analysis results of the copolymer D were C: 88.2 wt %, H: 7.9 wt %, and O: 3.3 wt %. The introduction amount of a hydroxy group (amount of an end group corresponding to c1) into the copolymer was 5.8 (groups/molecule). Further, the copolymer contained 79.2 mol % of a structural unit derived from divinylbenzene and a total of 20.7 mol % of structural units derived from styrene and ethylbenzene. The content of a vinyl group in the copolymer D was 32 mol %. Further, the TMA measurement results showed that Tg was 184° C. and the softening temperature was 300° C. or more. The TGA measurement results showed that the weight loss at 300° C. was 1.5 wt % and the heat discoloration resistance was evaluated as ×. The compatibility was evaluated as PETA: ○ and TMPTA: ○.

Comparative Example 2

32.4 mol (4618 mL) of divinylbenzene, 1.35 mol (192 mL) of ethylvinylbenzene, 11.3 mol (1291 mL) of styrene, 1.8 mol (237 mL) of butyl acetate, 16.5 mol (2519 mL) of phenol, and 13.79 L of toluene were loaded into a 30-L reaction vessel. To the reaction vessel were added 60 mmol of boron trifluoride diethyl ether complex at 70° C. The mixture was subjected to a reaction for 2.5 hours. After the polymerization solution had been terminated with 32.9 mL of 1-butanol, the reaction mixture solution was charged into a large amount of n-hexane at room temperature to precipitate a polymer. The resultant polymer was washed with n-hexane, separated by filtration, dried, and weighed to afford 2606 g of a copolymer E.

The resultant copolymer E had Mn of 1940, Mw of 5640, and Mw/Mn of 2.91. The elementary analysis results of the copolymer E were C: 85.8 wt %, H: 7.2 wt %, and O: 4.7 wt %. The introduction amount of a hydroxy group (amount of an end group corresponding to c1) into the copolymer was 4.0 (groups/molecule). Further, the copolymer contained 71.8 mol % of a structural unit derived from divinylbenzene and a total of 28.2 mol % of structural units derived from styrene and ethylbenzene. The content of a vinyl group in the copolymer E was 36 mol %. Further, Tg was 199° C., the softening temperature was 300° C. or more, the weight loss at 300° C. was 1.8 wt %, and the heat discoloration resistance was evaluated as ×. The compatibility was evaluated as PETA: ○ and TMPTA: ○.

Comparative Example 3

0.144 mol (21.3 mL) of divinylbenzene, 0.006 mol (0.86 mL) of ethylvinylbenzene, 18.9 mL of a solution of 1-chloroethylbenzene (12.0 mmol) in dichloroethane (0.634 mmol/mL), 3.3 mL of a solution of n-tetrabutylammonium bromide (0.45 mmol) in dichloroethane (0.135 mmol/mL), and 150 mL of dichloroethane (dielectric constant: 10.3) were loaded into a 300-mL flask. To the flask were added 6.6 mL of a solution of SnCl$_4$ (0.45 mmol) in dichloroethane (0.068 mmol/mL) at 70° C. The mixture was subjected to a reaction for 1 hour. After the polymerization reaction had been terminated with a small amount of methanol subjected to bubbling with nitrogen. Then, the reaction mixture solution was charged into a large amount of methanol at room temperature to precipitate a polymer. The resultant polymer was washed with methanol, separated by filtration, dried, and weighed to afford 14.14 g of a copolymer F.

The resultant copolymer F had Mn of 2580, Mw of 4230, and Mw/Mn of 1.6. The copolymer F contained 97 mol % of a structural unit derived from divinylbenzene and 3 mol % of a structural unit derived from ethylbenzene. The elementary analysis results of the copolymer F were C: 86.8 wt %, H: 7.4 wt %, O: 0.3 wt %, and Cl: 5.06 wt %. The introduction amount of a hydroxy group (amount of an end group corresponding to c1) into the end of the copolymer was 0.4 (group/molecule) and the introduction amount of chlorine was 3.8 (atoms/molecule). Further, Tg was 290° C., the softening temperature was 300° C. or more, the weight loss at 300° C. was 12.1 wt %, and the heat discoloration resistance was evaluated as ×. The compatibility was evaluated as PETA: × and TMPTA: ×.

Comparative Example 4

28.5 mol (4059 ml) of divinylbenzene, 1.5 mol (213.7 ml) of ethylvinylbenzene, 10.0 mol (1145.8 ml) of styrene, 16 mol (1655.7 ml) of benzyl alcohol, 4.80 mol (468.9 ml) of ethyl acetate, 7111 ml of toluene (dielectric constant: 2.3), and 6222 ml of cyclohexane (dielectric constant: 2.02) were loaded into a 30-L reaction vessel. To the reaction vessel were added 6.4 mol of boron trifluoride diethyl ether complex at 30° C. The mixture was subjected to a reaction for 5 hours. After the polymerization reaction had been terminated with 2845 g of calcium hydroxide, the resultant was filtered and washed three times with 5 L of distilled water. 8.0 g of butylhydroxytoluene were dissolved in the polymerization solution. After that, the whole was concentrated using an evaporator at 40° C. for 1 hour. The reaction mixture solution was charged into a large amount of methanol at room temperature to precipitate a polymer. The resultant polymer was washed with methanol, separated by filtration, dried, and weighed to afford 3356 g of a copolymer G (yield: 67.8 wt %).

The resultant copolymer G had Mn of 2100, Mw of 6230, and Mw/Mn of 2.97. The copolymer G had resonance lines derived from the benzyl ether end, the indan end, and the alcohol end. The ratio of the benzyl ether end in all oxygen-containing ends calculated based on the NMR measurement results was 79.4 mol %. The elementary analysis results of the copolymer G were C: 90.5 wt %, H: 7.6 wt %, and O: 2.4 wt %. The introduction amount of an aromatic hydrocarbon group (amount of an end group corresponding to c1) via an ether bond into the copolymer was 3.4 (groups/molecule). Further, the copolymer contained a total of 45.3 mol % of a structural unit derived from divinylbenzene and a total of 54.7 mol % of a structural unit derived from styrene, a structure derived from benzyl alcohol, and a structural unit derived from ethylvinylbenzene. Further, the copolymer G contained an indan structure in an amount of 5.5 mol % with respect to the total of structural units of all monomers. Further, Tg was 289° C., the softening temperature was 300° C. or more, the weight loss amount at 300° C. was 0.3 wt %, and the heat discoloration resistance was evaluated as ○. The compatibility was evaluated as PETA: × and TMPTA: ×. Further, a cast film of the copolymer G was a transparent film without cloudiness.

Example 5

1.80 mol (256.4 mL) of divinylbenzene, 0.075 mol (10.7 mL) of ethylvinylbenzene, 1.88 mol (214.8 mL) of styrene, 1.00 mol (108.7 mL) of anisole, 250.0 mL of butyl acetate, and 1000 mL of toluene were loaded into a 3.0-L reaction vessel. To the reaction vessel were added 120 mmol of boron trifluoride diethyl ether complex at 70° C. The mixture was subjected to a reaction for 4.0 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 235.7 g of a copolymer H.

The resultant copolymer H had Mn of 1270, Mw of 4210, and Mw/Mn of 3.33. The elementary analysis results of the copolymer were C: 87.0 wt %, H: 7.5 wt %, and O: 5.6 wt %. The introduction amount (c1) of a structural unit derived from anisole into the copolymer was 2.9 (groups/molecule). Further, the copolymer contained 56.8 mol % of a structural unit derived from divinylbenzene and a total of 43.2 mol % of structural units derived from styrene and ethylbenzene. The content of a vinyl group in the copolymer was 33.9 mol %. Further, no clear Tg was observed, the softening temperature was 300° C. or more, the weight loss at 300° C. was 0.18 wt %, and the heat discoloration resistance was evaluated as ○. On the other hand, the compatibility was evaluated as PETA: Δ and TMPTA: Δ.

All of the copolymers D to H were soluble in toluene, xylene, THF, dichloroethane, dichloromethane, or chloroform, and did not form any gel.

Example 5

1874.7 g (14.4 mol) of divinylbenzene, 867.8 g (8.4 mol) of ethylvinylbenzene, 749.9 g (7.2 mol) of styrene, 264.0 g (2.3 mol) of butyl acetate, 4640.4 g (22.5 mol) of 2-phenoxyethyl methacrylate, and 8410 g of toluene were loaded into a 30-L reaction vessel. To the reaction vessel were added 354.8 g (2.5 mol) of boron trifluoride diethyl ether complex at 50° C. The mixture was subjected to a reaction for 7.5 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 3640 g of a copolymer J (yield: 99.9 wt %).

The resultant copolymer J had Mn of 1970, Mw of 6230, and Mw/Mn of 3.16. The elementary analysis results of the copolymer J were C: 84.8 wt %, H: 7.3 wt %, and O: 7.9 wt %. The introduction amount (a1) of a structural unit derived from 2-phenoxyethyl methacrylate into the copolymer was 3.2 (groups/molecule). Further, the copolymer contained 54.7 mol % of a structural unit derived from divinylbenzene and a total of 45.3 mol % of structural units derived from styrene and ethylvinylbenzene. The content of a vinyl group in the copolymer was 20.8 mol %. Further, Tg was 275° C., the softening temperature was 300° C. or more, the weight loss at 300° C. was 1.5 wt %, and the heat discoloration resistance was evaluated as A.

Example 6

264.2 g (2.0 mol) of divinylbenzene, 11.1 g (0.08 mol) of ethylvinylbenzene, 219.0 g (2.1 mol) of styrene, 88 g (0.8 mol) of butyl acetate, 565.5 g (2.7 mol) of 2-phenoxyethyl methacrylate, and 997.1 g of toluene were loaded into a 30-L reaction vessel. To the reaction vessel were added 42.6 g of boron trifluoride diethyl ether complex at 50° C. The mixture was subjected to a reaction for 3 hours. After the polymerization solution had been terminated with a sodium bicarbonate aqueous solution, the oil layer was washed three times with pure water, and the reaction mixture solution was charged into a large amount of methanol at room temperature to precipitate a copolymer. The resultant copolymer was washed with methanol, separated by filtration, dried, and weighed to afford 241.8 g of a copolymer K (yield: 48.9 wt %).

The resultant copolymer K had Mn of 2690, Mw of 5160, and Mw/Mn of 1.92. The elementary analysis results of the copolymer K were C: 86.9 wt %, H: 7.4 wt %, and O: 5.7 wt %. The introduction amount (a1) of a structural unit derived from 2-phenoxyethyl methacrylate into the copolymer was 3.2 (groups/molecule). Further, the copolymer contained 60.0 mol % of a structural unit derived from divinylbenzene and a total of 40.0 mol % of structural units derived from styrene and ethylvinylbenzene. The content of a vinyl group in the copolymer was 37 mol %. Further, Tg was 272° C., the softening temperature was 300° C. or more, the weight loss at 300° C. was 1.5 wt %, and the heat discoloration resistance was evaluated as A. The measurement result of the total light transmittance using a turbidimeter was 88%.

Example 7

264.2 g (2.0 mol) of divinylbenzene, 11.1 g (0.08 mol) of ethylvinylbenzene, 219.0 g (2.1 mol) of styrene, 88 g (0.8 mol) of butyl acetate, 464.0 g (2.3 mol) of 2-phenoxyethyl methacrylate, and 997.1 g of toluene were loaded into a 30-L reaction vessel. To the reaction vessel were added 42.6 g of boron trifluoride diethyl ether complex at 50° C. The mixture was subjected to a reaction for 4 hours. After the polymerization solution had been terminated with a sodium bicarbonate aqueous solution, the oil layer was washed three times with pure water, and the reaction mixture solution was charged into a large amount of methanol at room temperature to precipitate a polymer. The resultant polymer was washed with methanol, separated by filtration, dried, and weighed to afford 532.5 g of a copolymer N (yield: 107.7 wt %).

The resultant copolymer N had Mn of 2370, Mw of 11,900, and Mw/Mn of 5.04. The elementary analysis results of the copolymer were C: 85.8 wt %, H: 7.3 wt %, and O: 6.8 wt %. The introduction amount (a1) of a structural unit derived from 2-phenoxyethyl methacrylate into the copolymer was 3.4 (groups/molecule). Further, the copolymer contained 59.0 mol % of a structural unit derived from divinylbenzene and a total of 41.0 mol % of structural units derived from styrene and ethylvinylbenzene. The content of a vinyl group in the copolymer was 20.0 mol %. Further, Tg was 272° C., the softening temperature was 300° C. or more, the weight loss at 300° C. was 1.5 wt %, and the heat discoloration resistance was evaluated as A. The measurement result of the total light transmittance using a turbidimeter was 88%.

All of the copolymers J, K, and N were soluble in toluene, xylene, THF, dichloroethane, dichloromethane, or chloroform, and did not form any gel.

The copolymers D to G, J, K, and N synthesized in the above-mentioned examples and comparative examples were each used to afford a resin composition and a cured product of the resin composition.

Examples 8 to 11 and Comparative Examples 6 to 8

Components shown in each of Tables 1 and 2 were blended with each other (numbers represent parts by weight) to afford a photosensitive resin composition. Next, the photosensitive resin composition is applied onto an untreated polymethyl methacrylate sheet (Delaglas A manufactured by Asahi Kasei Corporation: sheet thickness 1.00 mm) using a spin coater. To the coated surface, a protection film made of PET (thickness: 38 μm) subjected to a peeling treatment was attached. The resultant was then irradiated with ultraviolet rays at an intensity of 450 mW/cm² using a metal halide lamp under an air atmosphere, to thereby afford a sheet having a hard coat layer (thickness: 5 to 15 μm).

Examples 12, 13, and 17

Components shown in each of Tables 1 and 2 were blended with each other (numbers represent parts by weight) to afford a photosensitive resin composition for a hard coat layer of the present invention. Next, the photosensitive resin composition was applied onto an untreated MS resin sheet (Estyrene MS 600 manufactured by Nippon Steel Chemical Co., Ltd.: sheet thickness 2.00 mm) using a spin coater. After that, the same operations were performed as in Example 8 to afford a sheet having a hard coat layer (thickness: 10 to 15 μm).

A film provided with a hard coat layer obtained in each of the examples and comparative examples was evaluated for its performance by the following test method. Tables 1 and 2 show physical property values.

Pencil hardness: In accordance with JIS K 5400, the pencil hardness of the coated film having the above-mentioned composition was measured using a pencil scratch tester. That is, a polymethyl methacrylate sheet or an MS resin sheet having a hard coat layer (thickness: 15 μm) was scratched with a pencil at a 45° angle under a load of 1 kg from the upper side for a distance of about 5 mm. Then, the degree of scratches was observed. The measurement was performed five times, and the pencil hardness one rank softer than that generating scratches in two or more out of five measurements was described as a pencil hardness test result.

Scratch resistance test: A film was moved back and forth 200 times under a load of 200 g/cm² on steel wool #0000 using a rubbing fastness tester. Then, the condition of scratches was visually observed and evaluated based on a comparison with five grades of boundary samples. Evaluation: 5: no scratch and 1: scratch generation.

Adhesiveness: In accordance with JIS K 5400, 100 grids were prepared by making 11 cross-cuts in the longitudinal direction and 11 cross-cuts in the transverse direction on a film surface at a spacing of 1 mm or 2 mm. There is given the number of grids remaining without peeling off in the case where a cellophane tape or a gummed tape has been adhered to the surface and then pulled off at a time.

Bending property: A coated sheet was bent through an angle of 180° so that a UV coated surface formed an outer surface. A: The sheet has no abnormality in external appearance and is bendable. B: A fissure or peeling occurs on a coated film surface. C: Cracking occurs in the entire substrate.

Punching Processability

The resultant hard coated film was punched into a disk shape having a diameter of 150 mm using a punching apparatus ("Mark Andy 910" manufactured by Mark Andy Inc.). After that, the hard coated film having a disk shape was visually observed and evaluated based on the following criteria. It should be noted that the punching was performed from the side of the hard coated film, and a film or sheet substrate was punched into the same shape as that of the hard coated film. The evaluation is as follows:
A: None of floating and peeling was observed in the hard coated film;
B: Floating occurred at the end portion of the hard coated film; and
C: The hard coated film peeled off.

External appearance: The conditions such as cracks, whitening, and clouding of the surface were visually evaluated. Evaluation: A: satisfactory; B: minor crack generation; and C: remarkable crack generation.

Description of Marks in Tables

SR-268; SR-268 (tetraethylene glycol diacrylate) manufactured by Sartomer Company Inc.

Irgacure 184; Irgacure 184 (1-hydroxy-cyclohexyl-phenyl-ketone) manufactured by Ciba Specialty Chemicals Ltd.

DPHA; DPHA (dipentaerythritol hexaacrylate) manufactured by DAICEL-CYTEC Company LTD.

TMPTA; TMPTA (trimethylolpropane triacrylate) manufactured by DAICEL-CYTEC Company LTD.

PO-A: Light Acrylate PO-A (phenoxyethyl acrylate) manufactured by KYOEISHA CHEMICAL Co., LTD PETA-K: PETA-K (pentaerythritol tetraacrylate) manufactured by DAICEL-CYTEC Company LTD.

KRM8200: KRM8200 (hexafunctional urethane acrylate) manufactured by DAICEL-CYTEC Company LTD.

SR213: SR-213 (1,4-butanediol diacrylate) manufactured by Sartomer Company Inc.

SF8421: SF8421 (epoxy polyether-modified silicone) manufactured by Dow Corning Toray Co., Ltd.

US-350: SYMAC US-350 (silicone-acrylic polymer) manufactured by TOAGOSEI CO., LTD.

TABLE 1

|  | Example | | | | | | Comparative Example |
|---|---|---|---|---|---|---|---|
|  | 8 | 9 | 10 | 11 | 12 | 13 | 6 |
| CopolymerJ | 10 |  |  | 10 | 10 | 10 |  |
| CopolymerK |  | 10 |  |  |  |  |  |
| CopolymerN |  |  | 10 |  |  |  |  |
| PETA-K | 40 | 40 | 40 | 20 | 45 | 45 | 40 |
| TMPTA | 10 | 10 | 10 | 10 | 13 | 15 | 20 |
| DPHA |  |  |  | 20 |  |  |  |
| SF8421 |  |  |  |  | 2 |  |  |
| PO-A |  |  | 5 |  |  |  |  |
| KRM8200 | 25 | 25 | 25 | 25 | 30 | 30 | 25 |
| SR213 | 5 | 5 | 5 | 10 |  |  | 5 |
| SR268 | 5 | 5 | 5 |  |  |  | 5 |
| Methyl ethyl ketone |  |  |  |  | 66.7 | 66.7 |  |
| Irgacure 184 | 8 | 6 | 8 | 8 | 8 | 8 | 6 |
| Physical property value |  |  |  |  |  |  |  |
| Pencil hardness | 4 H | 3 H | 2 H | 2 H | 4 H | 4 H | B |
| Scratch resistance | 5 | 4 | 3 | 4 | 5 | 4 | 1 |
| Adhesiveness | 100 | 100 | 100 | 100 | 100 | 100 | 28 |
| Bending property | A | A | A | B | — | — | C |
| Punching processability | A | A | B | B | A | A | C |
| External appearance | A | A | A | A | A | A | B |

TABLE 2

|  | Example | | | | Comparative Example | |
|---|---|---|---|---|---|---|
|  | 14 | 15 | 16 | 17 | 7 | 8 |
| CopolymerJ | 10 |  | 10 | 10 |  |  |
| CopolymerK |  | 10 |  |  |  |  |
| CopolymerG |  |  |  |  | 10 | 10 |
| PETA-K | 40 | 40 | 40 | 45 | 40 | 40 |
| TMPTA | 10 | 5 | 15 | 13 | 10 | 15 |
| EBECRYL40 | 5 |  |  |  | 5 |  |

TABLE 2-continued

|  | Example | | | | Comparative Example | |
| --- | --- | --- | --- | --- | --- | --- |
|  | 14 | 15 | 16 | 17 | 7 | 8 |
| US-350 |  |  |  | 2 |  |  |
| SR285 |  | 20 | 5 |  |  | 5 |
| PO-A |  |  | 5 |  |  | 5 |
| KRM8200 | 25 | 25 | 25 | 30 | 25 | 25 |
| SR213 | 5 |  |  |  | 5 |  |
| SR268 | 5 |  |  |  | 5 |  |
| Methyl Ethyl ketone |  |  |  | 66.7 |  |  |
| Irgacure184 | 6 | 8 | 8 | 8 | 8 | 8 |
| Physical property value |  |  |  |  | Insoluble |  |
| Pencil hardness | 4 H | 4 H | 3 H | 4 H | — | H |
| Scratch resistance | 4 | 4 | 5 | 4 | — | 1 |
| Adhesiveness | 100 | 100 | 100 | 100 | — | 19 |
| Bending property | A | A | A | A | — | C |
| Punching processability | A | A | A | A | — | C |
| External appearance | A | A | A | A | — | B |

Examples 18 to 26 and Comparative Examples 9 to 14

Components shown in each of Tables 3 and 4 were blended with each other (numbers represent parts by weight) to afford a curable optical resin composition. Next, the curable optical resin composition was injected into a casting mold for preparation of a plate for measurement of optical characteristics and a bending test piece. Then, the mold was installed in an inert oven set at 40° C., and nitrogen replacement was performed for 30 minutes. After that, the nitrogen atmosphere was kept and the temperature was kept at 90° C. for 30 minutes, to 120° C. for 30 minutes, and at 150° C. for 1 hour, to thereby cure the curable optical resin composition, followed by cooling to 40° C. over 2 hours. After cooling, a plate for measurement of optical characteristics and a bending test piece were released from the mold, and various tests were performed.

Further, as for the mold release property and mold transfer property of the curable optical resin composition, a component C in blending components in each of Tables 3 and 4 was changed to Irgacure 184 (addition amount: 2.0 parts by weight), and a prism substrate was prepared in accordance with a test piece preparation method mentioned below to carry out a test. Tables 5 and 6 show the results.

Examples 27 to 35

A curable optical resin composition was obtained in accordance with each of the blending compositions shown in Table 7.

A spacer being made of silicone rubber and having a thickness of 200 μm was attached to an untreated glass substrate (50 mm×50 mm, thickness: 0.7 mm). The curable optical resin composition was applied into the spacer. After that, another untreated glass substrate (50 mm×50 mm, thickness: 0.7 mm) was used to cover the glass substrate from the side of the resin composition so as to prevent air bubbles from forming. Subsequently, a pressure was applied to the upper glass substrate so that a resin composition layer had a given thickness (200 μm).

After that, the side of the upper glass substrate was irradiated with ultraviolet rays at an intensity of 450 mW/cm$^2$ using a metal halide lamp to cure the resin composition layer. After that, a cured product (plate, thickness: 200 μm) of a liquid curable optical resin composition was released from between two glass substrates, and various tests were performed.

Further, as for the mold release property and mold transfer property of the curable optical resin composition, a prism substrate was prepared in accordance with a test piece preparation method mentioned below to carry out a test. Table 8 shows the results.

<Evaluation Method>

YI value, Haze, and total light transmittance: A flat plate test piece having a thickness of 4 mm or a thickness of 200 μm was produced and measured for its YI value (yellow index indicating the degree of yellowness), Haze (turbidity), and total light transmittance using a spectral color-difference meter (SZ-Σ90 manufactured by Nippon Denshoku Industries Co., Ltd.).

Refractive index and Abbe number: A test piece having a size of 4 cm×0.8 cm was produced and measured for its refractive index and Abbe number using a multi-wavelength Abbe refractometer ("Multi-wavelength Abbe Refractometer DR-M2" manufactured by ATAGO CO., LTD.). A methylene iodide containing sulfur solution having a higher refractive index than that of a sample was used as a contact liquid, and the refractive index and the Abbe number were measured using an interference filter for the D line at 589 nm.

Bending test: A tabular sample having a thickness of 3 mm and a width of 10 mm was produced, the distance between lower supports was set to 80 mm, and the bending modulus, bending strength, and deformation at break were measured using a bending tester ("AG-IS 10 kN" manufactured by Shimadzu Corporation). An average value of three measurement results was used as a measurement value.

Glass transition temperature: A probe for analysis was brought into contact with a sample in a TMA measurement apparatus. Scanning measurement was performed from 30° C. to 360° C. at a temperature increasing rate of 10° C./min in a stream of nitrogen. Then, Tg and an Sp value were determined by a tangent method.

Coefficient of linear thermal expansion (CTE): A probe for analysis was brought into contact with a sample in a thermo-mechanical analyzer (TMA). Scanning measurement was performed from 30° C. to 360° C. at a temperature increasing rate of 10° C./min in a stream of nitrogen to determine an average coefficient of linear thermal expansion.

Spectral transmittance: A test piece having a thickness of 4 mm was produced to measure spectral transmittance at 400 nm to 700 nm using a spectrophotometer ("CM-3600d" manufactured by Konica Minolta Holdings, Inc.).

Mold release property: A liquid curable optical resin composition was applied into a mold having a prism shape (hereinafter, abbreviated as a prism mold). After that, a 250 μm-thick polyethylene terephthalate (PET) film, both surfaces of which had been subjected to an easy-adhesion treatment (trade name "A4300" manufactured by Toyobo Co., Ltd.) (10 cm×10 cm) was used to cover the mold from the side of the resin composition so as to prevent air bubbles from forming. Subsequently, a pressure was applied to the PET film so that a resin composition layer had a given thickness (50 μm).

After that, the side of the substrate was irradiated with ultraviolet rays at an intensity of 450 mW/cm$^2$ using a metal halide lamp to cure the resin composition layer. Then, a prism substrate formed of the cured product of the liquid curable optical resin composition (prism) and the PET film was released manually.

Then, the prism mold and the molded prism substrate were observed visually and with a stereomicroscope and evaluated based on the following criteria.

A . . . No peeling of the cured resin occurs on the prism surface, none of fissures and deformation occurs in a prism layer, and none of floating and peeling occurs between the prism layer and the PET film.

B . . . The peeling of the cured resin is slightly observed on the prism surface, while none of fissures and deformation occurs in a prism layer and none of floating and peeling occurs between the prism layer and the PET film.

C . . . The peeling of the cured resin is remarkably observed on the prism surface, and at the same time, a fissure or deformation occurs in a prism layer and/or floating or peeling occurs between the prism layer and the PET film.

Mold transfer property: In accordance with the same procedure and condition as those in the test for evaluation of mold release property using the above-mentioned prism mold, a liquid curable optical resin composition was cured on a 250 μm-thick polyethylene terephthalate (PET) film, both surfaces of which had been subjected to an easy-adhesion treatment (trade name "A4300" manufactured by Toyobo Co., Ltd.) with ultraviolet rays to form a prism layer. Then, the molded prism substrate was cut using a universal cutting machine equipped with a diamond blade, the cross section was grinded using a rotary abrasive disk, and then the cross section of the prism layer was observed with a light microscope. The shape of the ridge portion of the prism layer was observed to perform an evaluation based on the following three criteria.

A . . . The shape of the ridge portion of the prism layer reproduces the shape of an acute-angled prism mold.

B . . . The shape of the ridge portion of the prism layer is slightly rounded.

C . . . The shape of the ridge portion of the prism layer is rounded, and minute irregularity is slightly observed at the prism surface portion.

Pencil hardness: In accordance with JIS K 5400, the pencil hardness of the coated film having the above-mentioned composition was measured using a pencil scratch tester. That is, an MS200 substrate having a lens layer (thickness: 15 μm) was scratched with a pencil at a 45° angle under a load of 1 kg from the upper side for a distance of about 5 mm. Then, the degree of scratches was observed. The measurement was performed five times, and the pencil hardness one rank softer than that generating scratches in two or more out of five measurements was described as a pencil hardness test result.

Cross-cut adhesion test: In accordance with JIS K 5400, 100 grids were prepared by making 11 cross-cuts in the longitudinal direction and 11 cross-cuts in the transverse direction on a film surface at a spacing of 1 mm or 2 mm. There is given the number of grids remaining without peeling off in the case where a cellophane tape or a gummed tape had been adhered to the surface and then pulled off at a time.

Description of Marks in Tables

FA-511AS: (dicyclopentenyl acrylate) manufactured by Hitachi Chemical Co., Ltd., FA-511AS FA-512AS: FA-512AS (dicyclopentenyloxyethyl acrylate) manufactured by Hitachi Chemical Co., Ltd.

FA-513AS: (dicyclopentanyl acrylate) manufactured by Hitachi Chemical Co., Ltd., FA-513AS AO-60: ADEKASTAB AO-60 manufactured by ADEKA CORPORATION Perbutyl O: Perbutyl O (t-butylperoxy-2-ethylhexanate) manufactured by NOF CORPORATION.

Perbutyl P: Perbutyl P (α,α'-di(t-butylperoxy)diisopropylbenzene) manufactured by NOF CORPORATION.

Irgacure 184: Irgacure 184 (1-hydroxy-cyclohexyl-phenyl-ketone) manufactured by Ciba Specialty Chemicals Ltd.

Darocure1173: polymerization initiator manufactured by Ciba Specialty Chemicals Ltd.

1,9ND-A: Light Acrylate 1,9ND-A (1,9-nonanediol acrylate) manufactured by KYOEISHA CHEMICAL Co., LTD EBECRYL8402: EBECRYL8402 (urethane acrylate) manufactured by DAICEL-CYTEC Company LTD.

SR-833S: SR-833S (tricyclodecane dimethanol diacrylate) manufactured by Sartomer Company Inc.

SR-285: SR-285 (tetrahydrofurfuryl acrylate) manufactured by Sartomer Company Inc.

PEMP: pentaerythritol tetrakis-3-mercaptopropionate

TABLE 3

|  | Example | | | Comparative Example | | | |
| --- | --- | --- | --- | --- | --- | --- | --- |
|  | 18 | 19 | 20 | 9 | 10 | 11 | 12 |
| CopolymerJ | 50 | 40 | 30 |  |  |  |  |
| CopolymerD |  |  |  | 50 |  |  |  |
| CopolymerE |  |  |  |  | 50 |  |  |
| CopolymerF |  |  |  |  |  | 50 |  |
| CopolymerG |  |  |  |  |  |  | 50 |
| FA-513AS | 50 | 60 | 70 | 50 | 50 | 50 | 50 |
| Perbutyl O | 0.2 | 0.2 | 0.2 | 0.2 | 0.2 | 0.2 | 0.2 |
| AO-60 | 0.2 | 0.2 | 0.2 | 0.2 | 0.2 | 0.2 | 0.2 |

TABLE 4

|  | Comparative Example | | Example | | | | | |
| --- | --- | --- | --- | --- | --- | --- | --- | --- |
|  | 13 | 14 | 21 | 22 | 23 | 24 | 25 | 26 |
| CopolymerJ | 50 |  | 45 | 40 | 50 | 50 |  |  |
| CopolymerK |  |  |  |  |  |  | 50 |  |
| CopolymerN |  |  |  |  |  |  |  | 50 |
| FA-511AS |  |  |  | 50 |  |  |  |  |
| FA-512AS |  |  |  |  | 50 |  |  |  |
| FA-513AS |  | 50 | 50 | 50 |  |  | 45 | 45 |
| Perbutyl O | 0.2 | 0.2 | 0.2 | 0.2 | 0.2 | 0.2 | 0.2 | 0.2 |
| PEMP |  |  | 5 | 10 |  |  |  |  |
| SR-285 | 50 | 50 |  |  |  |  | 5 |  |
| PO-A |  |  |  |  |  |  |  | 5 |
| AO-60 | 0.2 | 0.2 | 0.2 | 0.2 | 0.2 | 0.2 | 0.2 | 0.2 |

TABLE 5

|  | Example | | | Comparative Example | | | |
| --- | --- | --- | --- | --- | --- | --- | --- |
|  | 18 | 19 | 20 | 9 | 10 | 11 | 12 |
| Bending Modulus (GPa) | 3.29 | 2.87 | 3.13 | 1.67 | 1.54 | 1.63 | 1.74 |
| Bending strength (MPa) | 55.8 | 51.2 | 67.4 | 27.8 | 22.6 | 28.3 | 30.1 |

TABLE 5-continued

|  | Example | | | Comparative Example | | | |
|---|---|---|---|---|---|---|---|
|  | 18 | 19 | 20 | 9 | 10 | 11 | 12 |
| Deformation at break (%) | 1.56 | 1.59 | 1.94 | 1.03 | 0.98 | 0.99 | 1.04 |
| CTE (ppm/° C.) | 64.7 | 96.4 | 82.2 | 112.3 | 118.6 | 123.4 | 119.8 |
| YI | 1.28 | 2.11 | 2.46 | 8.65 | 9.21 | 10.2 | 12.1 |
| Total light transmittance | 91.4 | 91.5 | 91.2 | 90.4 | 90.0 | 89.3 | 89.0 |
| Refractive index | 1.559 | 1.556 | 1.550 | 1.550 | 1.561 | 1.559 | 1.561 |
| Abbe number | 37.8 | 40.9 | 43.3 | 33.2 | 32.5 | 31.0 | 30.2 |
| Mold release property | A | A | A | C | C | C | C |
| Mold transfer property | A | A | A | B | C | C | C |

TABLE 6

|  | Comparative Example | | Example | | | | | |
|---|---|---|---|---|---|---|---|---|
|  | 13 | 14 | 21 | 22 | 23 | 24 | 25 | 26 |
| Bending Modulus (GPa) | 2.16 | 2.08 | 2.52 | 2.77 | 2.76 | 2.62 | 2.55 | 2.66 |
| Bending strength (MPa) | 29.7 | 32.1 | 90.2 | 93.5 | 60.7 | 51.3 | 52.1 | 61.4 |
| Deformation at break (%) | 1.02 | 1.04 | 4.32 | 3.75 | 2.29 | 1.90 | 2.31 | 2.89 |
| CTE (ppm/° C.) | 125.2 | 114.6 | 107.8 | 104.9 | 92.7 | 106.1 | 98.7 | 102.1 |
| YI | 8.99 | 7.86 | 2.12 | 3.45 | 1.96 | 1.78 | 3.67 | 3.02 |
| Total light transmittance | 90.2 | 90.3 | 91.2 | 91.0 | 90.7 | 91.4 | 91.0 | 91.1 |
| Refractive index | 1.537 | 1.521 | 1.565 | 1.563 | 1.573 | 1.567 | 1.562 | 1.559 |
| Abbe number | 32.1 | 33.3 | 38.7 | 40.5 | 36.9 | 37.8 | 36.8 | 37.2 |
| Mold release property | C | C | A | A | A | A | A | A |
| Mold transfer property | B | C | A | A | A | A | A | A |

TABLE 7

| Example | 27 | 28 | 29 | 30 | 31 | 32 | 33 | 34 | 35 |
|---|---|---|---|---|---|---|---|---|---|
| CopolymerJ | 30 |  |  | 30 | 40 | 45 | 33 |  |  |
| CopolymerK |  | 30 |  |  |  |  |  | 30 |  |
| CopolymerN |  |  | 30 |  |  |  |  |  | 30 |
| SR-833S | 40 | 40 | 40 | 40 | 35 | 30 | 40 | 40 | 40 |
| Irgacure184 | 2 | 2 | 2 |  | 2 | 2 | 2 | 1.5 | 1.5 |
| Darocure1173 |  |  |  | 2 |  |  |  | 2.5 | 2.5 |
| SR285 | 5 | 5 | 5 | 5 |  |  | 2 |  |  |
| 1.9ND-A | 15 | 15 | 15 | 15 | 15 | 15 | 15 | 20 | 20 |
| EBECRYL 8402 | 10 | 10 | 10 | 10 | 10 | 10 | 10 | 10 | 10 |

TABLE 8

| Example | 27 | 28 | 29 | 30 | 31 | 32 | 33 | 34 | 35 |
|---|---|---|---|---|---|---|---|---|---|
| Film thickness (μm) | 14 | 13 | 13 | 10 | 33 | 36 | 12 | 15 | 17 |
| Cross-cut adhesion test (1 mm) | 100 | 100 | 100 | 100 | 100 | 100 | 100 | 100 | 100 |
| (2 mm) | 100 | 100 | 100 | 100 | 100 | 72 | 100 | 100 | 100 |
| Pencil hardness | F | F | F | F | H | F | F | F | F |
| YI | 1.32 | 1.44 | 1.44 | 1.53 | 4.76 | 5.66 | 3.57 | 9.12 | 7.96 |
| Total light transmittance | 91.69 | 91.78 | 91.82 | 91.82 | 91.47 | 90.83 | 91.63 | 90.45 | 90.27 |
| Refractive index | 1.5498 | 1.5514 | 1.5489 | 1.5497 | 1.5562 | 1.5607 | 1.5513 | 1.5508 | 1.5497 |
| Abbe number | 42.3 | 40.8 | 42.6 | 42 | 40.9 | 37.6 | 41.1 | 40.75 | 41.9 |
| Spectral transmittance (% T) | | | | | | | | | |
| 400 nm | 87.35 | 86.9 | 87.02 | 86.46 | 76.48 | 73.61 | 86.06 | 87.02 | 87.3 |
| 450 nm | 89.86 | 89.92 | 89.73 | 89.52 | 86.77 | 85.81 | 89.95 | 89.95 | 89.8 |

TABLE 8-continued

| Example | 27 | 28 | 29 | 30 | 31 | 32 | 33 | 34 | 35 |
|---|---|---|---|---|---|---|---|---|---|
| 545 nm | 90.76 | 91.07 | 90.88 | 90.78 | 90.32 | 90.14 | 91.16 | 91.14 | 90.53 |
| Mold release property | A | A | A | A | A | A | A | A | A |
| Mold transfer property | A | A | A | A | A | A | A | A | A |

INDUSTRIAL APPLICABILITY

The end-modified soluble polyfunctional vinyl aromatic copolymer of the present invention has improved heat resistance, compatibility, and heat discoloration resistance. According to the production method of the present invention, the above-mentioned copolymer can be produced with high efficiency. Further, the photosensitive resin composition of the present invention is suitable for providing a hard coat layer on a plastic film and sheet substrate. In particular, the photosensitive resin composition is satisfactory in adhesiveness to polyester, an acrylic resin, an MS resin, polyether sulfone, triacetylcellulose, or the like, which has not been subjected to a treatment (easy-adhesion treatment), and is excellent in scratch resistance and pencil hardness of the resultant hard coat layer. A plastic film and sheet, each of which has not been subjected to an easy-adhesion treatment, can be used as a film substrate, and hence, a film and sheet having a hard coat layer can be produced at a low cost. Such film and sheet are suitably used particularly in fields requiring high hardness such as plastic optical parts, touch panels, flat displays, film liquid crystal devices. In addition, the curable optical resin composition of the present invention provides a cured product as an optical material having mold transfer property during molding, mold release property, and low water absorbency improved, being excellent in transparency, heat resistance, and mechanical strength, and having less characteristic change due to an environmental change.

The invention claimed is:

1. A soluble polyfunctional vinyl aromatic copolymer, comprising a copolymer which is obtained by allowing the following compounds to react through a cation copolymerization with each other:
a divinyl aromatic compound (a);
a monovinyl aromatic compound (b); and
an aromatic ether compound (c),
wherein:
the copolymer has, at an end, an end group derived from the aromatic ether compound (c), wherein said end group is represented by the following formula (1):

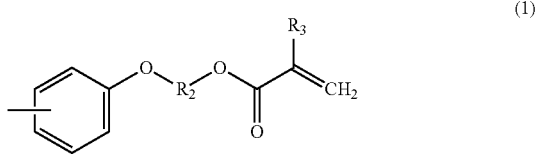

(1)

where:
$R_2$ represents a hydrocarbon group having 1 to 18 carbon atoms and optionally including an oxygen atom or a sulfur atom; and $R_3$ represents hydrogen or a methyl group;
the copolymer has a number average molecular weight Mn of 500 to 100,000;
the copolymer has a molecular weight distribution (Mw/Mn) of 100.0 or less, the molecular weight distribution being represented by a ratio of a weight average molecular weight Mw to a number average molecular weight Mn;
an introduction amount (c1) of the end group satisfies the following inequality (2):

$$(c1) \geq 1.0 \text{(group/molecule)} \qquad (2);$$

a molar fraction a' of a structural unit derived from the divinyl aromatic compound, a molar fraction b' of a structural unit derived from the monovinyl aromatic compound, and a molar fraction c' of the end group in the copolymer satisfy relationships of the following inequalities (3) and (4):

$$0.05 \leq a'/(a'+b') \leq 0.95 \qquad (3),$$

$$0.005 \leq c'/(a'+b') < 2.0 \qquad (4); \text{ and}$$

the copolymer is soluble in toluene, xylene, tetrahydrofuran, dichloroethane, or chloroform.

2. A production method for a soluble polyfunctional vinyl aromatic copolymer, comprising allowing the following compounds to react through a cation copolymerization with each other:
a divinyl aromatic compound (a);
a monovinyl aromatic compound (b); and
an aromatic ether compound (c),
wherein:
5 to 95 mol % of the divinyl aromatic compound (a) and 95 to 5 mol % of the monovinyl aromatic compound (b) are used with respect to 100 mol % of a total of the divinyl aromatic compound (a) and the monovinyl aromatic compound (b);
0.5 to 500 mol of the aromatic ether compound (c) represented by the following formula (7):

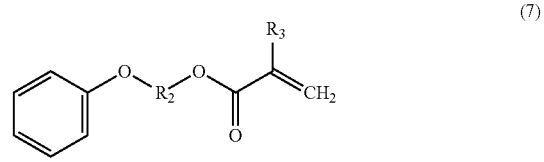

(7)

where: $R_2$ represents a hydrocarbon group having 1 to 18 carbon atoms and optionally including an oxygen atom or a sulfur atom; and $R_3$ represents hydrogen or a methyl group with respect to 100 mol of all monomers, and one or more kinds of catalysts selected from the group consisting of a Lewis acid catalyst, an inorganic strong acid, and an organic sulfonic acid are further used;
polymerization raw materials including the compounds and the catalysts are dissolved in a solvent having a dielectric constant of 2.0 to 15.0 to form a uniform solvent; and the compounds are polymerized at a temperature of 20 to 120° C. in the uniform solvent to provide a copolymer having, at an end, a end group represented by the following formula (1):

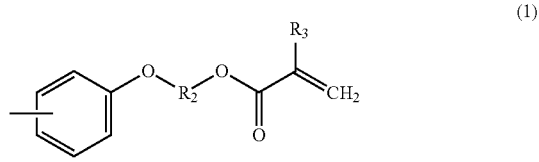
(1)

where: $R_2$ represents a hydrocarbon group having 1 to 18 carbon atoms and optionally including an oxygen atom or a sulfur atom; and $R_3$ represents hydrogen or a methyl group at a ratio of 1.0 (group/molecule) or more and being soluble in toluene, xylene, tetrahydrofuran, dichloroethane, or chloroform.

3. A production method for a soluble polyfunctional vinyl aromatic copolymer according to claim 2, wherein the catalysts comprise a Lewis acid catalyst including a metal fluoride or a complex thereof.

4. A production method for a soluble polyfunctional vinyl aromatic copolymer according to claim 2, wherein the catalysts are used in a range of 0.001 to 10 mol with respect to 1 mol of the aromatic ether compound (c).

5. A photosensitive resin composition, comprising:
a component (A): the soluble polyfunctional vinyl aromatic copolymer according to claim 1;
a component (B): one or more kinds of photo curable polyfunctional (meth)acrylates having at least three (meth)acryloyl groups in a molecule; and
a component (C): a photopolymerization initiator,
wherein the component (A) is blended in an amount of 1 to 75 wt %, the component (B) is blended in an amount of 98.9 to 10 wt %, and the component (C) is blended in an amount of 0.1 to 15 wt %.

6. A photosensitive resin composition according to claim 5, further comprising, as a component (D), 0.1 to 20 wt % of one or more kinds of (meth)acrylate compounds selected from the group consisting of monofunctional and bifunctional acrylates.

7. A photosensitive resin cured product, wherein the photosensitive resin cured product is obtained by curing the photosensitive resin composition according to claim 5.

8. A hard coated film or sheet, wherein the hard coated film or sheet is obtained by applying the photosensitive resin composition according to claim 5 onto a substrate having a film or sheet shape, and curing the resultant with active energy rays.

9. A curable resin composition, comprising:
a component (A): the soluble polyfunctional vinyl aromatic copolymer according to claim 1; and
a component (F): one or more kinds of polymerizable unsaturated monomers each having a cycloalkyl group and having one or two (meth)acryloyl groups in a molecule,
wherein the component (A) is blended in an amount of 1 to 80 wt % and the component (F) is blended in an amount of 99 to 20 wt %.

10. A curable resin composition according to claim 9, wherein the polymerizable unsaturated monomers as component (F) comprise one or more kinds of polymerizable unsaturated monomers selected from the group consisting of a dicyclopentanyl(meth)acrylate represented by the following general formula (11):

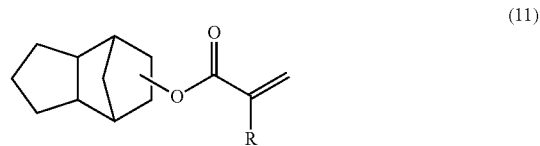
(11)

where R represents hydrogen or a methyl group;
a dicyclopentanyloxyalkyl(meth)acrylate represented by the following general formula (12):

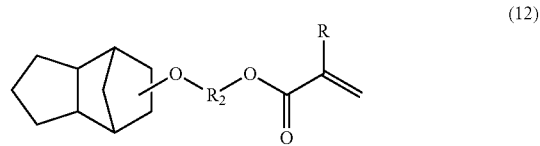
(12)

where: R represents hydrogen or a methyl group; $R_2$ represents an alkylene group having 2 to 12 carbon atoms or an oxyalkylene group having a total of 4 to 12 carbon atoms in which two or more alkylene groups having at least two carbon atoms are bonded to each other via an oxygen atom;
a dicyclopentenyl(meth)acrylate represented by the following general formula (13):

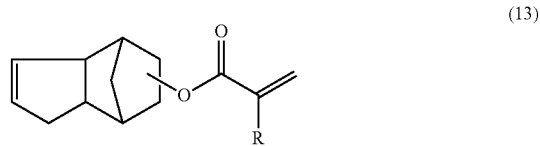
(13)

where R represents hydrogen or a methyl group;
a dicyclopentenyloxyalkyl(meth)acrylate represented by the following general formula (14):

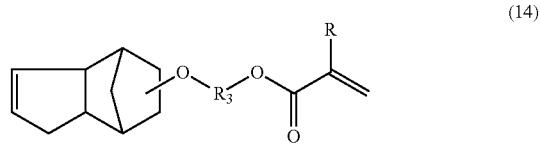
(14)

where: R represents hydrogen or a methyl group; $R_3$ represents an alkylene group having 2 to 12 carbon atoms or an oxyalkylene group having a total of 4 to 12 carbon atoms in which two or more alkylene groups having at least two carbon atoms are bonded to each other via an oxygen atom;

an isobornyl(meth)acrylate represented by the following general formula (15):

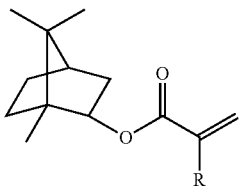
(15)

where R represents hydrogen or a methyl group;
an isobornyl oxyalkyl(meth)acrylate represented by the following general formula (16):

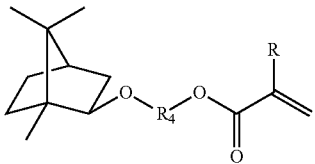
(16)

where: R represents hydrogen or a methyl group; $R_4$ represents an alkylene group having 2 to 12 carbon atoms or an oxyalkylene group having a total of 4 to 12 carbon atoms in which two or more alkylene groups having at least two carbon atoms are bonded to each other via an oxygen atom; and
a tricyclodecane dimethanol di(meth)acrylate represented by the following general formula (17):

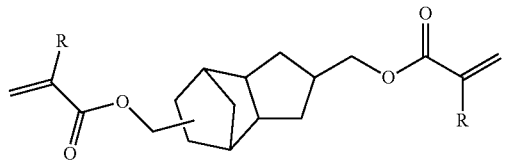
(17)

where R represents hydrogen or a methyl group.

11. A curable resin composition according to claim 9, comprising, as a component (G), 0.01 to 15 wt % of a polymerization initiator based on a sum of the component (A) and the component (F).

12. A curable resin composition according to claim 9, comprising, as a component (H), 0.5 to 40 wt % of a polyfunctional thiol compound.

13. A curable resin composition according to claim 9, comprising, as a component (I), 1 to 40 wt % of a polymerizable unsaturated monomer having 1 to 10 (meth)acryloyl groups excluding the component (F).

14. An optical resin cured product, wherein the optical resin cured product is obtained by curing the curable resin composition according to claim 9.

15. An optical material, wherein the optical material is obtained by curing and molding the curable resin composition according to claim 9.

16. An optical film, wherein the optical film is obtained by molding and curing the curable resin composition according to claim 9 into a film shape.

* * * * *